(12) United States Patent
Han et al.

(10) Patent No.: US 11,690,271 B2
(45) Date of Patent: Jun. 27, 2023

(54) DISPLAY DEVICE INCLUDING AN OPENING AREA AND SENSING ELECTRODES

(71) Applicant: SAMSUNG DISPLAY CO., LTD., Yongin-si (KR)

(72) Inventors: Hyeyun Han, Yongin-si (KR); Gyeongnam Bang, Yongin-si (KR); Changho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/472,513

(22) Filed: Sep. 10, 2021

(65) Prior Publication Data
US 2021/0408142 A1 Dec. 30, 2021

Related U.S. Application Data

(63) Continuation of application No. 16/686,842, filed on Nov. 18, 2019, now Pat. No. 11,121,192.

(30) Foreign Application Priority Data

Jan. 30, 2019 (KR) ........................ 10-2019-0011985

(51) Int. Cl.
*G09G 5/00* (2006.01)
*H10K 59/40* (2023.01)
(Continued)

(52) U.S. Cl.
CPC ............. *H10K 59/40* (2023.02); *H10K 50/84* (2023.02); *H10K 50/86* (2023.02); *H10K 59/121* (2023.02); *H10K 59/131* (2023.02)

(58) Field of Classification Search
CPC . H01L 27/323; H01L 27/326; H01L 27/3276; H01L 51/5237
(Continued)

(56) References Cited

U.S. PATENT DOCUMENTS 9,146,413 B2   9/2015   Kim
9,236,862 B2   1/2016   Fix et al.
(Continued)

FOREIGN PATENT DOCUMENTS

KR   10-2014-0040428   4/2014
KR   10-1398171   5/2014
(Continued)

OTHER PUBLICATIONS

U.S. Office Action dated Feb. 22, 2021, issued in U.S. Appl. No. 16/482,238 (16 pages).
(Continued)

*Primary Examiner* — Jonathan M Blancha
(74) *Attorney, Agent, or Firm* — Lewis Roca Rothgerber Christie LLP

(57) ABSTRACT

A display device includes a substrate including an opening area and a display area at least partially surrounding the opening area; and a metal layer including a first region and a second region adjacent to a non-display area between the opening area and the display area, the first region and the second region are spaced apart from each other, and one of the first region and the second region includes a protrusion extending toward the other of the first region and the second region, and the other of the first region and the second region has a shape to receive the protrusion.

22 Claims, 36 Drawing Sheets

(51) Int. Cl.
*H10K 50/84* (2023.01)
*H10K 50/86* (2023.01)
*H10K 59/121* (2023.01)
*H10K 59/131* (2023.01)

(58) Field of Classification Search
USPC .......................................................... 345/156
See application file for complete search history.

(56) References Cited

U.S. PATENT DOCUMENTS

| | | | |
|---|---|---|---|
| 11,243,645 B2* | 2/2022 | Kim | G06F 3/0448 |
| 2008/0117497 A1* | 5/2008 | Shimodaira | G02F 1/167 |
| | | | 361/748 |
| 2013/0147727 A1* | 6/2013 | Lee | H01L 27/323 |
| | | | 345/173 |
| 2013/0279769 A1 | 10/2013 | Benkley et al. | |
| 2014/0354586 A1 | 12/2014 | Yousefpor et al. | |
| 2016/0170524 A1 | 6/2016 | Kim et al. | |
| 2016/0270234 A1 | 9/2016 | Ahn | |
| 2017/0097703 A1 | 4/2017 | Lee | |
| 2017/0139513 A1 | 5/2017 | Hong et al. | |
| 2017/0287992 A1 | 10/2017 | Kwak et al. | |
| 2017/0294502 A1 | 10/2017 | Ka et al. | |
| 2018/0035541 A1 | 2/2018 | Kamijo et al. | |
| 2018/0307346 A1 | 10/2018 | Lee et al. | |
| 2018/0342700 A1 | 11/2018 | Cai et al. | |
| 2019/0073056 A1 | 3/2019 | Takada | |
| 2019/0079622 A1* | 3/2019 | Choi | G06F 3/0446 |
| 2020/0144535 A1 | 5/2020 | Kim | |
| 2020/0168633 A1* | 5/2020 | Ina | H01L 29/404 |
| 2020/0236259 A1* | 7/2020 | Nakamura | G02F 1/133512 |

FOREIGN PATENT DOCUMENTS

| | | |
|---|---|---|
| KR | 10-1437034 | 11/2014 |
| KR | 10-2014-0142370 | 12/2014 |
| KR | 10-2017-0111827 | 10/2017 |
| KR | 10-2018-0117768 A | 10/2018 |
| WO | WO 2013/013905 A1 | 1/2013 |
| WO | WO 2018008820 | 1/2018 |

OTHER PUBLICATIONS

U.S. Notice of Allowance dated Sep. 22, 2021, issued in U.S. Appl. No. 16/482,238 (8 pages).

* cited by examiner

DISPLAY DEVICE INCLUDING AN OPENING AREA AND SENSING ELECTRODES

CROSS-REFERENCE TO RELATED APPLICATIONS

This application is a continuation of U.S. patent application Ser. No. 16/686,842, filed Nov. 18, 2019, which claims priority to and the benefit of Korean Patent Application No. 10-2019-0011985, filed Jan. 30, 2019, the entire content of both of which is incorporated herein by reference.

BACKGROUND

1. Field

Aspects of embodiments relate to a display device.

2. Description of the Related Art

Recently, the purposes of a display device have become more diversified. Also, as display devices have become thinner and more lightweight, their range of use has gradually been extended.

As an area occupied by a display area of display devices increases, functions that may be combined or associated with the display device are being added. As a way of adding various functions while increasing an area, research into a display device including an opening in a display area is in progress.

SUMMARY

According to an aspect of one or more embodiments, a display device includes an opening area or an opening that is at least partially surrounded by a display area.

Additional aspects will be set forth, in part, in the description which follows and, in part, will be apparent from the description, or may be learned by practice of the presented embodiments.

According to one or more embodiments, a display device includes: a substrate including an opening area and a display area at least partially surrounding the opening area; and a metal layer including a first region and a second region adjacent to a non-display area between the opening area and the display area, wherein the first region and the second region are spaced apart from each other, and one of the first region and the second region includes a protrusion extending toward the other of the first region and the second region, and the other of the first region and the second region has a shape to receive the protrusion.

The metal layer may include a metal having a light-blocking characteristic.

The first region and the second region may be arranged in a circumferential direction surrounding an edge of the opening area.

The display device may further include: an input sensing layer located in the display area and including first sensing electrodes and second sensing electrodes adjacent to the first sensing electrodes.

One of the first region and the second region may be connected to one of the first sensing electrodes that is adjacent to the opening area, and the other of the first region and the second region may be connected to one of the second sensing electrodes that is adjacent to the opening area.

The first region or the second region connected to one of the first sensing electrodes may be adjacent to one of the second sensing electrodes that is adjacent to the opening area, and the first region or the second region connected to one of the second sensing electrodes may be adjacent to one of the first sensing electrodes that is adjacent to the opening area.

The first sensing electrodes may be arranged in a first direction, and the second sensing electrodes may be arranged in a second direction crossing the first direction.

The first sensing electrodes and the second sensing electrodes may be alternately arranged in a second direction crossing a first direction.

The first region and the second region may be arranged on a same layer on which one of the first sensing electrodes and the second sensing electrodes is arranged.

The display device may further include a first sub-connection electrode located in the non-display area and electrically connected to the first sensing electrodes spaced apart by the opening area.

The first sub-connection electrode may include a first electrode having a ring shape along a circumferential direction surrounding an edge of the opening area; and a second electrode protruding in a radial direction of the opening area from the first electrode having the ring shape.

The first region may overlap a portion of the first sub-connection electrode and may be electrically connected to the first sub-connection electrode.

The display device may further include: a second sub-connection electrode located in the non-display area and electrically connected to the second sensing electrodes spaced apart by the opening area.

The second sub-connection electrode and the second region may be arranged on a same layer.

According to one or more embodiments, a display device includes: a substrate including an opening area and a display area at least partially surrounding the opening area; a plurality of pixels arranged in the display area; an encapsulation layer covering the plurality of pixels; an input sensing layer arranged over the encapsulation layer; and a metal layer arranged over the encapsulation layer and including a first region and a second region adjacent to a non-display area between the opening area and the display area, wherein one of the first region and the second region includes a protrusion extending toward the other of the first region and the second region, and the other of the first region and the second region has a shape to receive the protrusion.

The first region and the second region may be arranged in a circumferential direction surrounding an edge of the opening area.

The input sensing layer may include: first sensing electrodes; and second sensing electrodes adjacent to the first sensing electrodes.

One of the first region and the second region may be connected to one of the first sensing electrodes that is adjacent to the opening area, and the other of the first region and the second region may be connected to one of the second sensing electrodes that is adjacent to the opening area.

The first region or the second region connected to one of the first sensing electrodes may be adjacent to one of the second sensing electrodes that is adjacent to the opening area, and the first region or the second region connected to one of the second sensing electrodes may be adjacent to one of the first sensing electrodes that is adjacent to the opening area.

The first region and the second region may be arranged on a same layer on which one of the first sensing electrodes and the second sensing electrodes is arranged.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
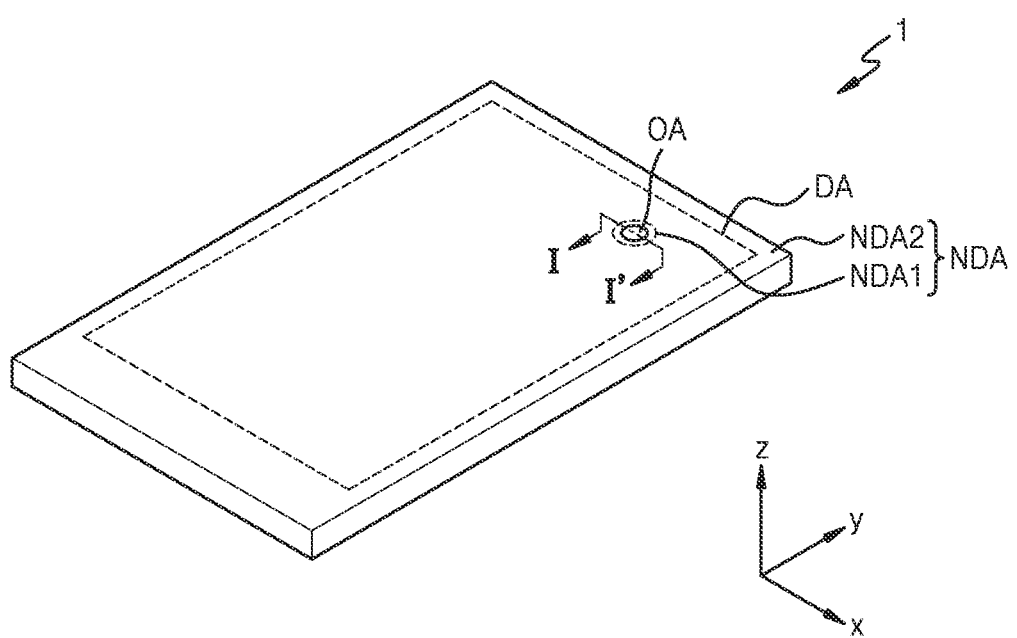
FIG. 1 is a perspective view of a display device according to an embodiment.

As the present disclosure allows for various changes and numerous embodiments, some example embodiments will be illustrated in the drawings and described in further detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Herein, the disclosure will be described more fully with reference to the accompanying drawings, in which some example embodiments of the disclosure are shown. When description is made with reference to the drawings, like reference numerals in the drawings denote like or corresponding elements, and repeated description thereof will be omitted.

As used herein, the term "and/or" includes any and all combinations of one or more of the associated listed items.

Expressions such as "at least one of," when preceding a list of elements, modify the entire list of elements and do not modify the individual elements of the list.

It is to be understood that although the terms "first," "second," etc. may be used herein to describe various components, these components should not be limited by these terms. These components are used to distinguish one component from another.

As used herein, the singular forms "a," "an," and "the" are intended to include the plural forms as well, unless the context clearly indicates otherwise.

It is to be further understood that the terms "comprises/ includes" and/or "comprising/including" used herein specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It is to be understood that when a layer, region, or component is referred to as being "connected" to another layer, region, or component, it may be directly connected to the other layer, region, or component or may be indirectly connected to the other layer, region, or component with one or more other layers, regions, or components interposed therebetween. For example, it is to be understood that when a layer, region, or component is referred to as being "connected to or electrically connected" to another layer, region, or component, it may be directly connected or electrically connected to the other layer, region, or component or may be indirectly connected or electrically connected to other layer, region, or component with one or more other layers, regions, or components interposed therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display device 1 according to an embodiment.

Referring to FIG. 1, the display device 1 includes a display area DA and a non-display area NDA that does not emit light. The non-display area NDA is adjacent to the display area DA. The display device 1 may produce an image (e.g., a predetermined image) by using light emitted from a plurality of pixels arranged in the display area DA.

The display device 1 includes an opening area OA at least partially surrounded by the display area DA. In an embodiment, as is shown in FIG. 1, the opening area OA is entirely surrounded by the display area DA. In an embodiment, the non-display area NDA includes a first non-display area NDA1 surrounding the opening area OA, and a second non-display area NDA2 surrounding the display area DA. In an embodiment, the first non-display area NDA1 may entirely surround the opening area OA, the display area DA may entirely surround the first non-display area NDA1, and the second non-display area NDA2 may entirely surround the display area DA.

Although an organic light-emitting display device is exemplarily described as the display device 1 according to an embodiment below, the display device is not limited thereto. In another embodiment, any of various types of display devices, such as an inorganic light-emitting display and a quantum dot light-emitting display, may be used.

Figure 2:
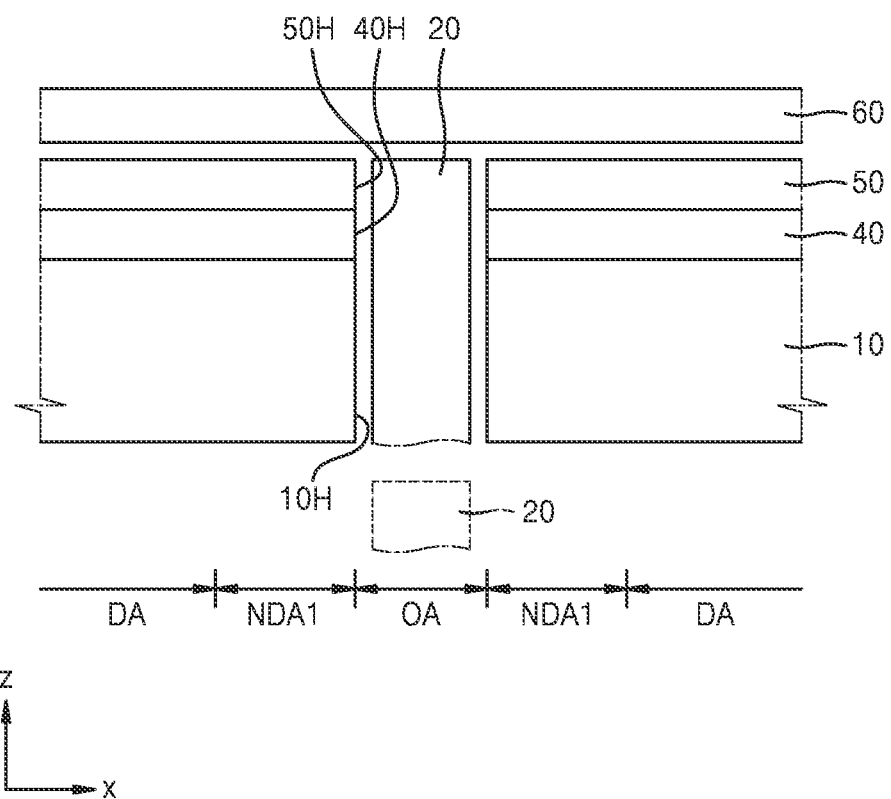
FIG. 2 is a cross-sectional view of a display device according to an embodiment.

FIG. 2 is a cross-sectional view of the display device 1 according to an embodiment and may correspond to a cross-section taken along the line I-I' of FIG. 1.

Referring to FIG. 2, the display device 1 may include a display panel 10, an input sensing layer 40, and an optical functional layer 50 arranged on the display panel 10. These layers may be covered by a window 60. The display device 1 may include any of various electronic devices, such as mobile phones, notebook computers, and smartwatches.

The display panel 10 may display an image. The display panel 10 includes pixels arranged in the display area DA. Each of the pixels may include a display element and a pixel circuit connected thereto. The display element may include an organic light-emitting diode, an inorganic light-emitting diode, or a quantum dot light-emitting diode.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be arranged on the display panel 10.

The input sensing layer 40 may be directly formed on the display panel 10 or may be formed separately and then coupled to the display panel 10 by using an adhesive layer, such as an optical clear adhesive (OCA). For example, the input sensing layer 40 may be successively formed after a process of forming the display panel 10. In this case, the adhesive layer may not be arranged between the input sensing layer 40 and the display panel 10. Although FIG. 2 shows that the input sensing layer 40 is arranged between the display panel 10 and the optical functional layer 50, the input sensing layer 40 may be arranged on the optical functional layer 50 in another embodiment.

The optical functional layer 50 may include a reflection prevention layer. The reflection prevention layer may reduce reflectivity of light (external light) incident from the outside toward the display panel 10 through the window 60. In an embodiment, the reflection prevention layer may include a retarder and a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film. The retarder and the polarizer themselves or their protective films may be defined as a base layer of the reflection prevention layer.

In another embodiment, the reflection prevention layer may include a black matrix and color filters. The color filters may be arranged by taking into account colors of light emitted respectively from pixels of the display panel 10. In another embodiment, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may create destructive interference and, thus, the reflectivity of external light may be reduced.

The optical functional layer 50 may include a lens layer. The lens layer may improve the emission efficiency of light emitted from the display panel 10 or reduce the color deviation of light. The lens layer may include a layer having a concave or convex lens shape and/or include a plurality of layers respectively having different refractive indexes. The optical functional layer 50 may include both the reflection prevention layer and the lens layer or may include one of the reflection prevention layer and the lens layer.

The display panel 10, the input sensing layer 40, and/or the optical functional layer 50 may include an opening. With regard to this, FIG. 2 shows that the display panel 10, the input sensing layer 40, and the optical functional layer 50 respectively include first to third openings 10H, 40H, and 50H and that the first to third openings 10H, 40H, and 50H thereof overlap each other. The first to third openings 10H, 40H, and 50H are located to correspond to the opening area OA. In another embodiment, at least one of the display panel 10, the input sensing layer 40, or the optical functional layer 50 may not include an opening. For example, one or two of the display panel 10, the input sensing layer 40, and the optical functional layer 50 may not include an opening. Herein, the opening area OA may represent at least one of the first to third openings 10H, 40H, and 50H, respectively, of the display panel 10, the input sensing layer 40, and the optical functional layer 50. For example, in the present specification, the opening area OA may represent the first opening 10H of the display panel 10.

A component 20 may correspond to the opening area OA. As shown by a solid line in FIG. 2, the component 20 may be located in the first to third openings 10H, 40H, and 50H or, as shown by a dotted line, the component 20 may be located below the display panel 10.

The component 20 may include an electronic element. For example, the component 20 may include an electronic element that uses light or sound. For example, an electronic element may be a sensor, such as an infrared sensor, that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands, such as visible light, infrared light, and ultraviolet light. In an embodiment, the opening area OA may be understood as a transmission area through which light and/or sound, which are output from the component 20 to the outside or propagate toward the electronic element from the outside, may pass.

In another embodiment, in a case in which the display device 1 is used as a smartwatch or an instrument panel for an automobile, for example, the component 20 may be a member including a needle of a clock or a needle, etc. indicating predetermined information (e.g., the velocity of a vehicle, etc.). In the case in which the display device 1 includes the component 20, such as a needle of a clock or an instrument panel for an automobile, the component 20 may be exposed to the outside through the window 60, which may include an opening corresponding to the opening area OA.

As described above, the component 20 may include one or more elements related to a function of the display panel 10 or an element such as an accessory that increases an aesthetic sense of the display panel 10.

Although it is shown in FIG. 2 that the window 60 is spaced apart from the optical functional layer 50 by an interval (e.g., a predetermined interval), a layer including an OCA may be located between the window 60 and the optical functional layer 50.

Figure 3:
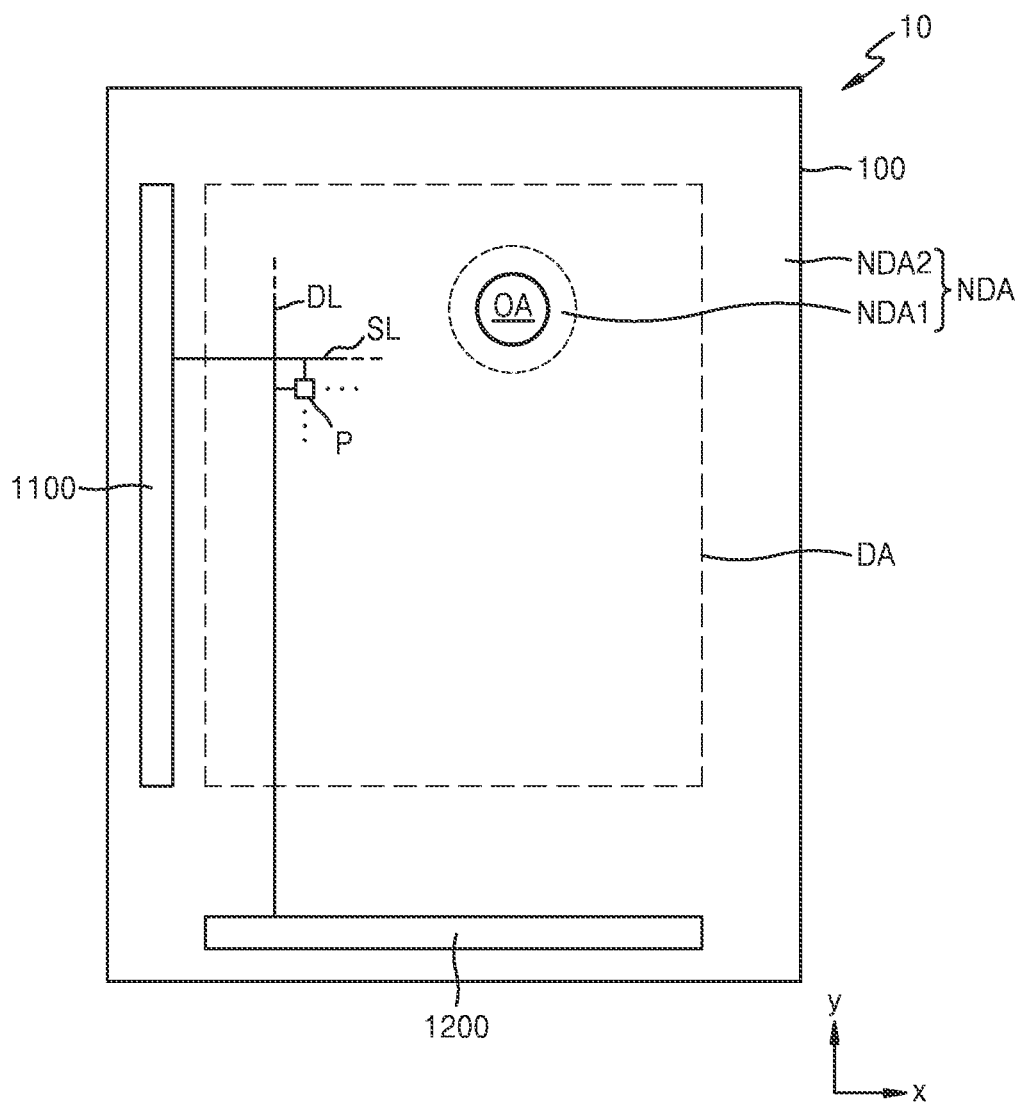
FIG. 3 is a plan view of a display panel according to an embodiment.
Figure 4:
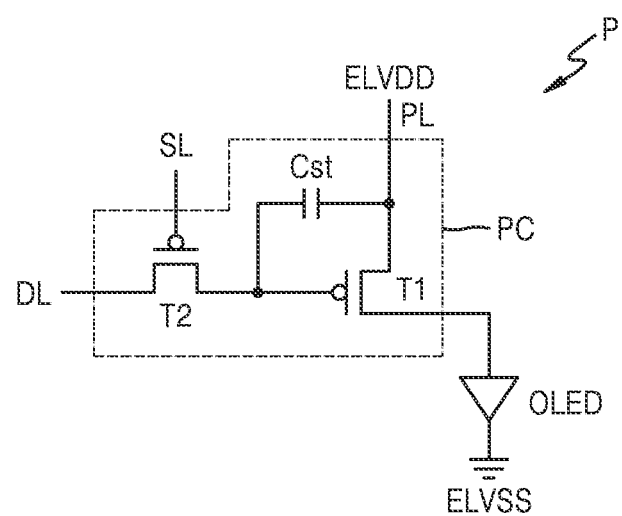
FIG. 4 is an equivalent circuit diagram of one of pixels of a display panel.

FIG. 3 is a plan view of the display panel 10 according to an embodiment; and FIG. 4 is an equivalent circuit diagram of one of pixels of the display panel 10.

Referring to FIG. 3, the display panel 10 includes the display area DA, the first non-display area NDA1, and the second non-display area NDA2. FIG. 3 may be understood as a figure of a substrate 100. For example, it may be understood that the substrate 100 includes the opening area OA, the display area DA, the first non-display area NDA1, and the second non-display area NDA2. Although not shown, the substrate 100 may include an opening corresponding to the opening area OA, for example, an opening passing through a top surface and a bottom surface of the substrate 100.

The display panel 10 includes a plurality of pixels P arranged in the display area DA. As shown in FIG. 4, in an embodiment, each pixel P includes a pixel circuit PC and an organic light-emitting diode OLED as a display element connected to the pixel circuit PC. The pixel circuit PC may include a first transistor T1, a second transistor T2, and a capacitor Cst. Each pixel P may emit, for example, red, green, blue, or white light through the organic light-emitting diode OLED. The first transistor T1 and the second transistor T2 may be implemented as a thin film transistor.

The second transistor T2 is a switching thin film transistor and is connected to a scan line SL and a data line DL, and may transfer a data voltage input from the data line DL to the first transistor T1 in response to a switching voltage input from the scan line SL. The capacitor Cst may be connected to the second transistor T2 and a driving voltage line PL and may store a voltage corresponding to a difference between a voltage transferred from the second transistor T2 and a first power voltage ELVDD supplied from the driving voltage line PL.

The first transistor T1 is a driving transistor and may be connected to the driving voltage line PL and the capacitor Cst and may control a driving current flowing through the organic light-emitting diode OLED from the driving voltage line PL in response to the voltage value stored in the capacitor Cst. The organic light-emitting diode OLED may emit light having brightness (e.g., predetermined brightness) by using the driving current. An opposite electrode (e.g. a cathode) of the organic light-emitting diode OLED may receive a second power voltage ELVSS.

Although it is shown in FIG. 4 that the pixel circuit PC includes two transistors and one capacitor, the present disclosure is not limited thereto. The number of transistors and the number of capacitors may be variously modified depending on a design of the pixel circuit PC.

Referring to FIG. 3 again, the first non-display area NDA1 may surround the opening area OA. The first non-display area NDA1 is an area in which a display element such as the organic light-emitting diode OLED is not arranged. Signal lines configured to provide a signal to pixels P arranged around the opening area OA may pass across the first non-display area NDA1, or groove(s), which will be described below, may be arranged in the first non-display area NDA1. A scan driver 1100 configured to provide a scan signal to each pixel P, a data driver 1200 configured to provide a data signal to each pixel P, main power wirings (not shown) configured to provide a first power voltage ELVDD and a second power voltage ELVSS, etc. may be arranged in the second non-display area NDA2. Although it is shown in FIG. 4 that the data driver 1200 is adjacent to one side of the substrate 100, the data driver 1200 may be arranged on a flexible printed circuit board (FPCB) electrically connected to a pad arranged on one side of the display panel 10 according to another embodiment.

Figure 5:
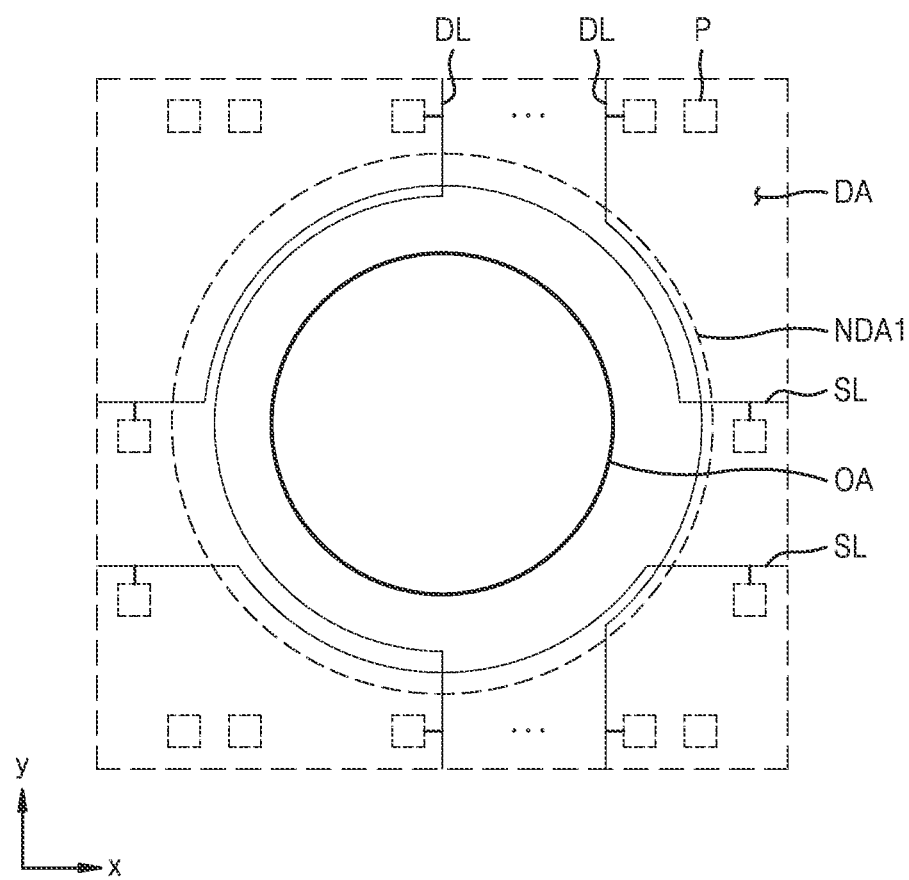
FIGS. 5 and 6 are plan views of a portion of a display panel according to an embodiment.

FIG. 5 is a plan view of a portion of the display panel 10 according to an embodiment and shows wirings, for example, signal lines, located in the first non-display area NDA1.

Referring to FIG. 5, pixels P may be arranged around the opening OA in the display area DA, and the first non-display area NDA1 may be arranged between the opening area OA and the display area DA.

Pixels P may be spaced apart from each other around the opening area OA. The pixels P may be spaced apart up and down around the opening area OA, or spaced apart left and right around the opening area OA.

Signal lines adjacent to the opening area OA among the signal lines configured to supply a signal to the pixels P may detour (or bypass) around the opening OA. Some of the data lines DL that pass across the display area DA may extend in a y-direction so as to provide a data signal to the pixels P arranged up and down with the opening area OA therebetween, and detour along an edge of the opening area OA in the first non-display area NDA1. Some of the scan lines SL that pass across the display area DA may extend in an x-direction so as to provide a scan signal to the pixels P arranged left and right with the opening area OA therebetween, and detour along an edge of the opening area OA in the first non-display area NDA1.

Figure 6:
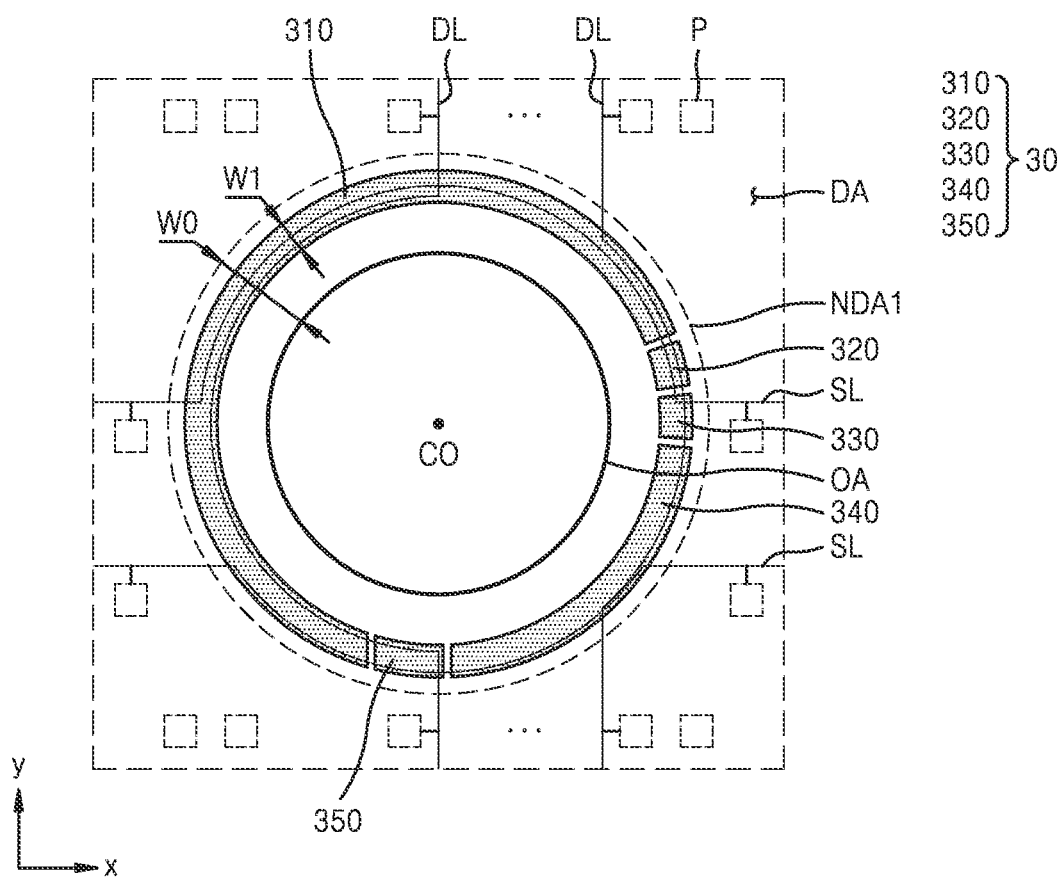

FIG. 6 is a plan view of a portion of the display panel 10 according to an embodiment and shows a metal layer 30 and signal lines located in the first non-display area NDA1.

Referring to FIG. 6, the metal layer 30 is arranged in the first non-display area NDA1 surrounding the opening area OA. A width W1 of the metal layer 30 may be less than a width W0 of the first non-display area NDA1. Alternatively, the width W1 of the metal layer 30 may be the same as the width W0 of the first non-display area NDA1. Here, the width W1 of the metal layer 30 and the width W0 of the first non-display area NDA1 may respectively denote distances in a radial direction from a center CO of the opening area OA.

The metal layer 30 may include metal that does not transmit light, that is, that has a light-blocking characteristic. For example, the metal layer 30 may include any of Mo, Al, Cu, and Ti and may include a single layer or a multi-layer including any of the above materials. In an embodiment, the metal layer 30 may include a multi-layer including Ti/Al/Ti.

The metal layer 30 may cover signal lines arranged therebelow, for example, the data lines DL and/or the scan lines SL described with reference to FIG. 5. Light incident toward the display panel 10 from the outside may be reflected by the data lines DL and/or the scan lines SL and may progress to the outside. The metal layer 30 may prevent or substantially prevent light reflected by the data lines DL and/or the scan lines SL from being provided to a user by blocking light progressing to the data lines DL and/or the scan lines SL from the outside.

In an embodiment, the metal layer 30 may include a plurality of areas. The plurality of areas may be spaced apart from each other. With regard to this, although it is shown in FIG. 6 that the metal layer 30 includes first to fifth regions 310, 320, 330, 340, and 350, the present disclosure is not limited thereto. The metal layer 30 may include two or more areas, and the number of areas may be variously changed.

In an embodiment, the first to fifth regions 310, 320, 330, 340, and 350 may be arranged in a circumferential direction surrounding an edge of the opening area OA. The first to fifth regions 310, 320, 330, 340, and 350 may be spaced apart from each other.

In an embodiment, the metal layer 30 may be concurrently (e.g., simultaneously) formed during a process of forming the input sensing layer 40 described with reference to FIG. 2. With regard to the structure of the metal layer 30, the input sensing layer 40 is described below first, and the structure of the metal layer 30 is described.

Figure 7:
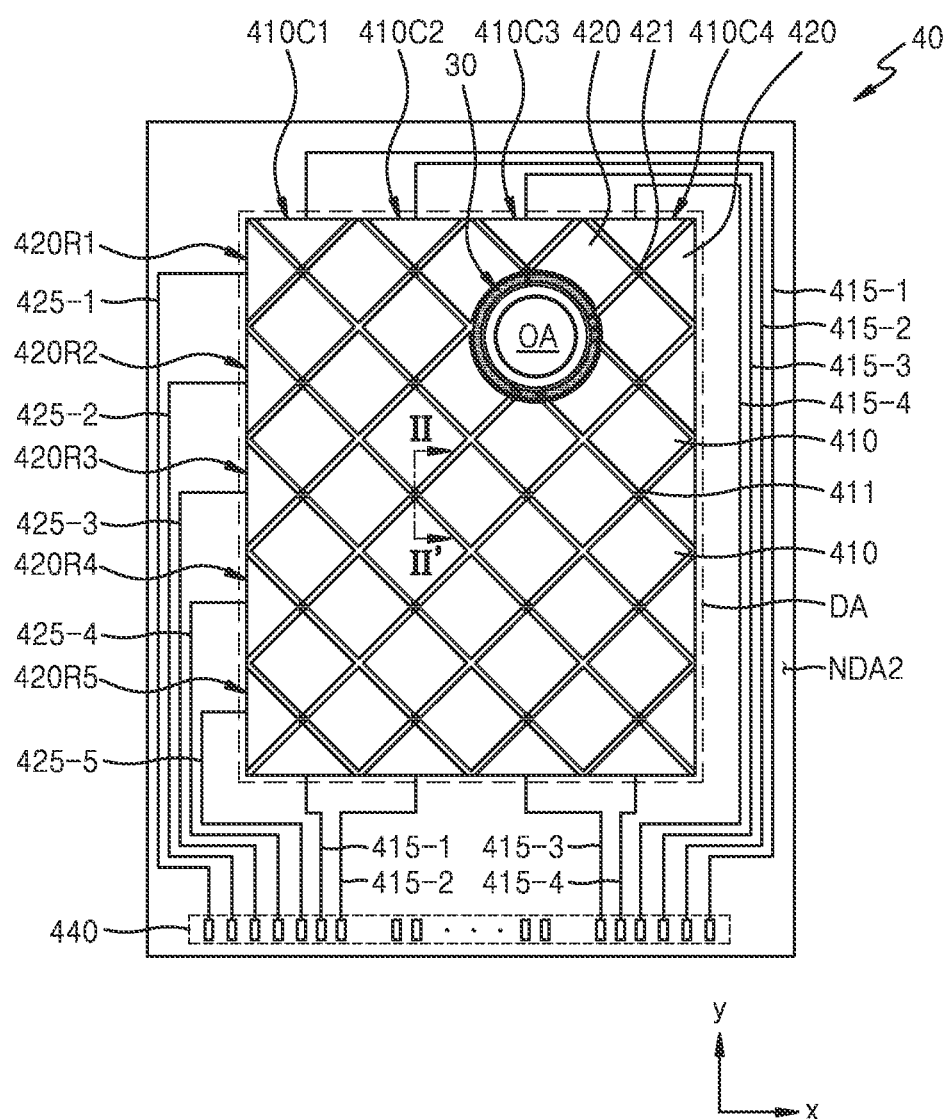
FIG. 7 is a plan view of an input sensing layer of a display panel according to an embodiment.
Figure 8:
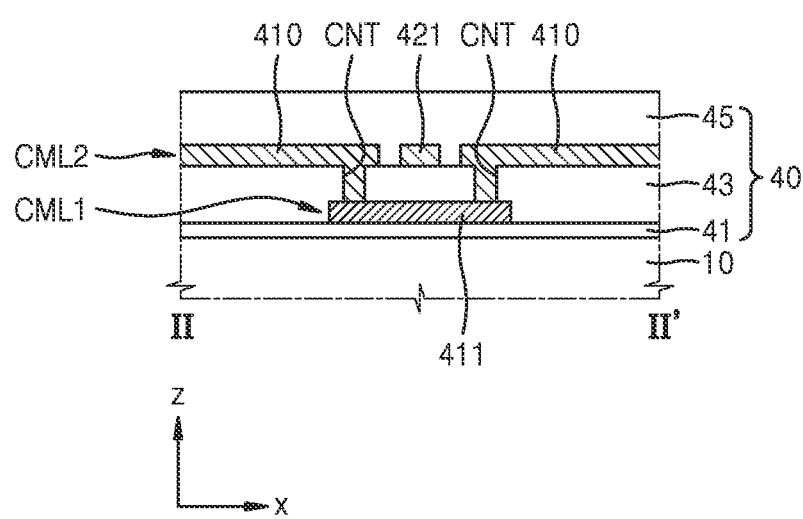
FIG. 8 is a cross-sectional view of the input sensing layer taken along the line II-II' of FIG. 7.
Figure 9A:
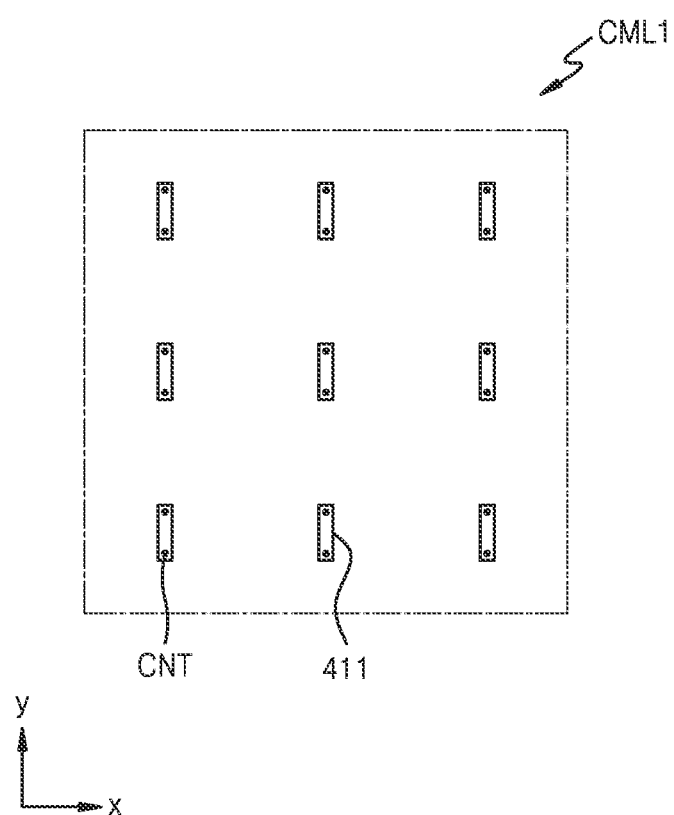
FIG. 9A is a plan view of a first conductive layer of FIG. 8.
Figure 9B:
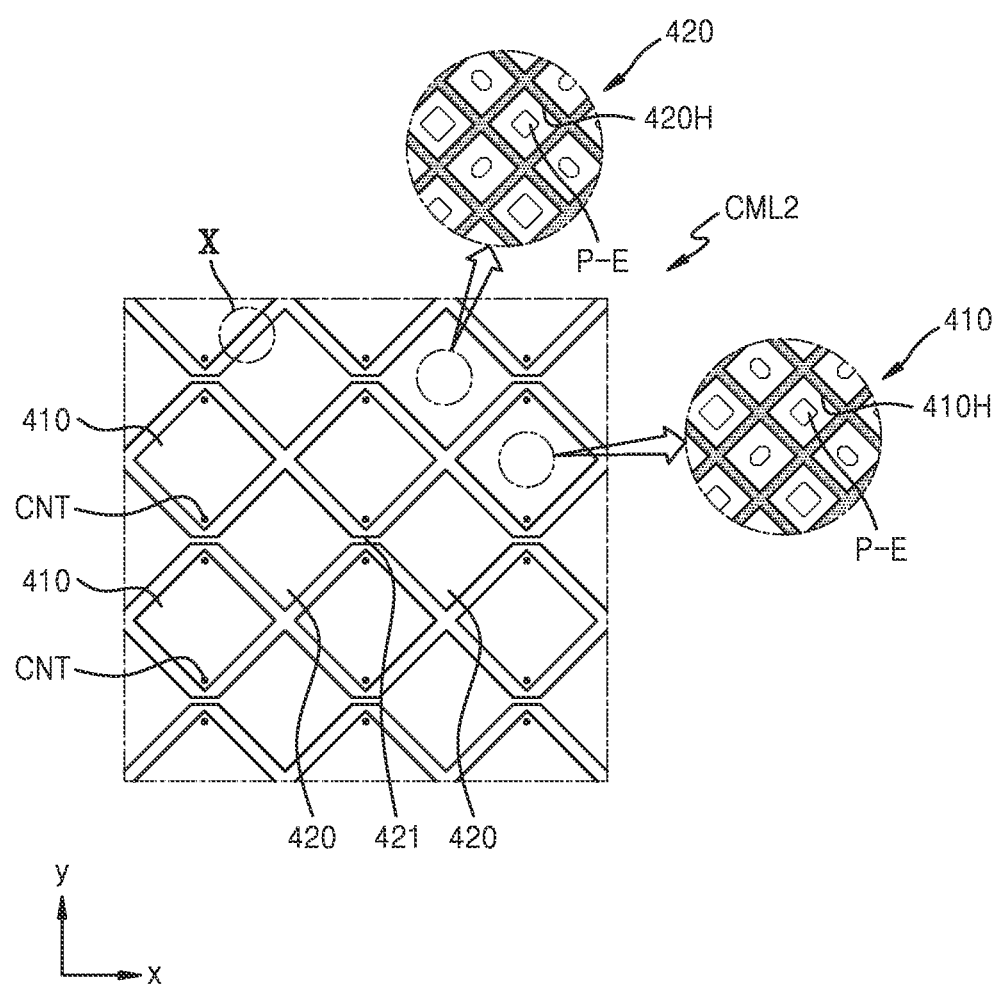
FIGS. 9B to 9D are plan views of a second conductive layer of FIG. 8.
Figure 9C:
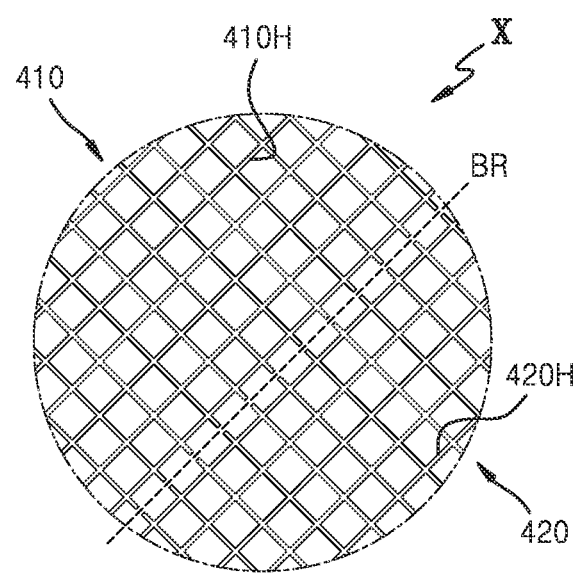
Figure 9D:
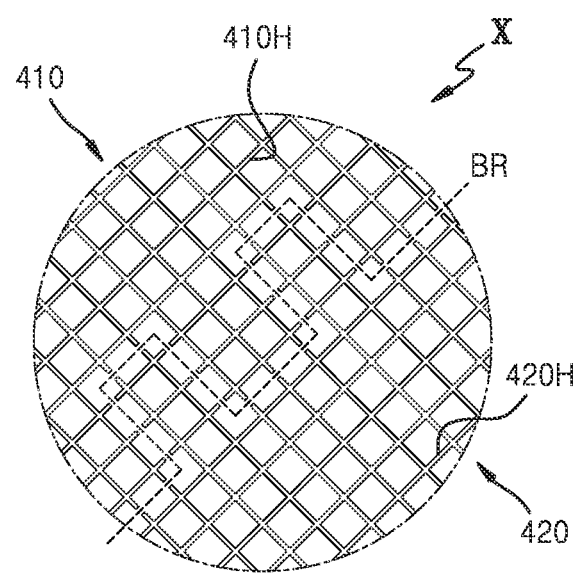

FIG. 7 is a plan view of the input sensing layer 40 of the display panel 10 according to an embodiment; FIG. 8 is a cross-sectional view of the input sensing layer 40 taken along the line II-II' of FIG. 7; FIG. 9A is a plan view of a first conductive layer of FIG. 8; and FIGS. 9B to 9D are plan views of a second conductive layer of FIG. 8.

Referring to FIG. 7, the input sensing layer 40 may include first sensing electrodes 410, first trace lines 415-1, 415-2, 415-3, and 415-4 connected to the first sensing electrodes 410, second sensing electrodes 420, and second trace lines 425-1, 425-2, 425-3, 425-4, and 425-5 connected to the second sensing electrodes 420. The input sensing layer 40 may sense an external input using a mutual cap method and/or a self cap method.

The first sensing electrodes 410 may be arranged in a y-direction, and the second sensing electrodes 420 may be arranged in an x-direction intersecting with or crossing the y-direction. The first sensing electrodes 410 arranged in the y-direction may be connected to each other by a first connection electrode 411 between the first sensing electrodes 410 that are adjacent to each other and may constitute respective first sensing lines 410C1, 410C2, 410C3, and 410C4. The second sensing electrodes 420 arranged in the x-direction may be connected to each other by a second connection electrode 421 between the second sensing electrodes 420 that are adjacent to each other and may constitute respective second sensing lines 420R1, 420R2, 420R3, 420R4, and 420R5. The first sensing lines 410C1, 410C2, 410C3, and 410C4 and the second sensing lines 420R1, 420R2, 420R3, 420R4, and 420R5 may intersect with each other. For example, the first sensing lines 410C1, 410C2, 410C3, and 410C4 and the second sensing lines 420R1, 420R2, 420R3, 420R4, and 420R5 may be perpendicular to each other.

The first sensing lines 410C1, 410C2, 410C3, and 410C4 and the second sensing lines 420R1, 420R2, 420R3, 420R4, and 420R5 may be arranged in the display area DA and connected to a sensing signal pad 440 through the first trace lines 415-1, 415-2, 415-3, and 415-4 and the second trace lines 425-1, 425-2, 425-3, 425-4, and 425-5. The first sensing lines 410C1, 410C2, 410C3, and 410C4 may be respectively connected to the first trace lines 415-1, 415-2, 415-3, and 415-4, and the second sensing lines 420R1, 420R2, 420R3, 420R4, and 420R5 may be respectively connected to the second trace lines 425-1, 425-2, 425-3, 425-4, and 425-5.

It is shown in FIG. 7 that the first trace lines 415-1, 415-2, 415-3, and 415-4 are connected to a top side and a bottom side of the first sensing lines 410C1, 410C2, 410C3, and 410C4. Through this structure, sensing sensitivity may be improved. However, the present disclosure is not limited thereto. In another embodiment, the first trace lines 415-1, 415-2, 415-3, and 415-4 may be connected to only a top side or a bottom side of the first sensing lines 410C1, 410C2, 410C3, and 410C4. An arrangement configuration of the first trace lines 415-1, 415-2, 415-3, and 415-4 and the second trace lines 425-1, 425-2, 425-3, 425-4, and 425-5 may be variously changed depending on a shape, a size of the display area DA, or a sensing method, etc. of the input sensing layer 40.

In an embodiment, the first sensing electrode 410 and the second sensing electrode 420 may have a rhombus or generally rhombus shape. The first sensing electrode 410 and the second sensing electrode 420 that are adjacent to the opening area OA may have a shape in which at least one side thereof adjacent to the opening area OA has been transformed along a circumference of the opening area OA. Accordingly, areas of the first sensing electrode 410 and the second sensing electrode 420 that are adjacent to the opening area OA may be less than areas of the first sensing electrode 410 and the second sensing electrode 420 in other areas. Areas or sizes of the first sensing electrode 410 and the second sensing electrode 420 that are adjacent to the opening area OA may be different from each other. In an embodiment, the metal layer 30 arranged in a circumferential direction surrounding the opening area OA may include a same material as that of one of the first sensing electrode 410 and the second sensing electrode 420 and may be formed during a same process as a process of forming of one of the first sensing electrode 410 and the second sensing electrode 420.

The input sensing layer 40 may include a plurality of conductive layers. Referring to FIG. 8, the input sensing layer 40 may include a first conductive layer CML1 and a second conductive layer CML2 arranged over the display panel 10. A first insulating layer 41 may be arranged between the first conductive layer CML1 and the display panel 10. A second insulating layer 43 may be arranged between the first conductive layer CML1 and the second conductive layer CML2. A third insulating layer 45 may be arranged on the second conductive layer CML2.

In an embodiment, the first and second insulating layers 41 and 43 may include an inorganic insulating layer including silicon nitride, and the third insulating layer 45 may include an organic insulating layer. Although it is shown in FIG. 8 that the first insulating layer 41 is arranged between the display panel 10 and the first conductive layer CML1, the first insulating layer 41 may be omitted and the first conductive layer CML1 may be directly arranged on the display panel 10 in another embodiment. In another embodiment, the first and second insulating layers 41 and 43 may include an organic insulating layer.

As shown in FIG. 9A, the first conductive layer CML1 may include the first connection electrodes 411. As shown in FIG. 9B, the second conductive layer CML2 may include the first sensing electrodes 410, the second sensing electrodes 420, and the second connection electrodes 421. The second sensing electrodes 420 may be connected to each other by the second connection electrodes 421 formed on a same layer on which the second sensing electrodes 420 are arranged. The first sensing electrodes 410 may be connected to each other by the first connection electrodes 411 formed on a layer different from a layer on which the first sensing electrodes 410 are arranged. The first connection electrode 411 electrically connecting the first sensing electrodes 410 that neighbor each other may be connected to the first sensing electrodes 410 that neighbor each other through a contact hole CNT formed in the second insulating layer 43.

In an embodiment, the first and second conductive layers CML1 and CML2 include metal. For example, the first and second conductive layers CML1 and CML2 may include at least one of Mo, Al, Cu, Ti, etc. and may include a single layer or a multi-layer including the above materials. In an embodiment, the first and second conductive layers CML1 and CML2 include a multi-layer including Ti/Al/Ti.

Referring to enlarged views of FIGS. 9B to 9D, the first sensing electrode 410 may have a grid structure (or a lattice structure) including a plurality of holes 410H. The hole 410H may overlap an emission area P-E of a pixel. Similarly, the second sensing electrode 420 may have a grid structure (or a lattice structure) including a plurality of holes 420H. The hole 420H may overlap an emission area P-E of a pixel. The holes 410H and 420H may respectively have different areas. In an embodiment, a line width of each of lattice lines may be about several micrometers. In an embodiment, as shown in FIG. 9C, the first sensing electrode 410 and the second sensing electrode 420 may face each other with a virtual boundary line BR therebetween. In an embodiment, as shown in FIG. 9D, the first sensing electrode 410 and the second sensing electrode 420 may have a shape in which boundary sides thereof facing each other alternate with the virtual boundary line BR therebetween by having a protrusion pattern. Depending on the shapes of the boundary sides of the first sensing electrode 410 and the second sensing electrode 420, the boundary line BR may have a straight line shape as shown in FIG. 9C, or the boundary line BR may have a zigzag or curved shape as shown in FIG. 9D.

In an embodiment, the metal layer 30 shown in FIG. 7 may be concurrently (e.g., simultaneously) formed during a process of forming one of the first conductive layer CML1 and the second conductive layer CML2. For example, the metal layer 30 may be formed during a process of forming the second conductive layer CML2. In an embodiment, the metal layer 30 may be located on a same layer as a layer on which the first sensing electrode 410, the second sensing electrode 420, and/or the second connection electrode 421 are arranged and may include a same material as that of the first sensing electrode 410, the second sensing electrode 420, and/or the second connection electrode 421. In an embodiment, the second connection electrode 421 may be formed as one body with the second sensing electrode 420. In another embodiment, the metal layer 30 may be formed during a process of forming the first conductive layer CML1. In an embodiment, the metal layer 30 may be located on a same layer as a layer on which the first connection electrode 411 is arranged and may include a same material as that of the first connection electrode 411.

Although it is described in FIGS. 8 to 9B that the first sensing electrode 410 and the first connection electrode 411 are arranged on different layers, and the second sensing electrode 420 and the second connection electrode 421 are arranged on the same layer, the present disclosure is not limited thereto. In another embodiment, the first sensing electrodes 410 and the first connection electrodes 411 may be arranged on a same layer (e.g., the second conductive layer), and the second sensing electrode 420 and the second connection electrode 421 may be arranged on different layers and connected to each other through a contact hole passing through the second insulating layer 43.

Although it is described in FIGS. 8 to 9B that the first and second sensing electrodes 410 and 420 are included in the second conductive layer CML2, the present disclosure is not limited thereto. In another embodiment, the first sensing electrode 410 and the second sensing electrode 420 may be respectively arranged on different layers. For example, one of the first sensing electrode 410 and the second sensing electrode 420 may be formed in the first conductive layer CML1, and the other may be formed in the second conductive layer CML2.

Figure 10:
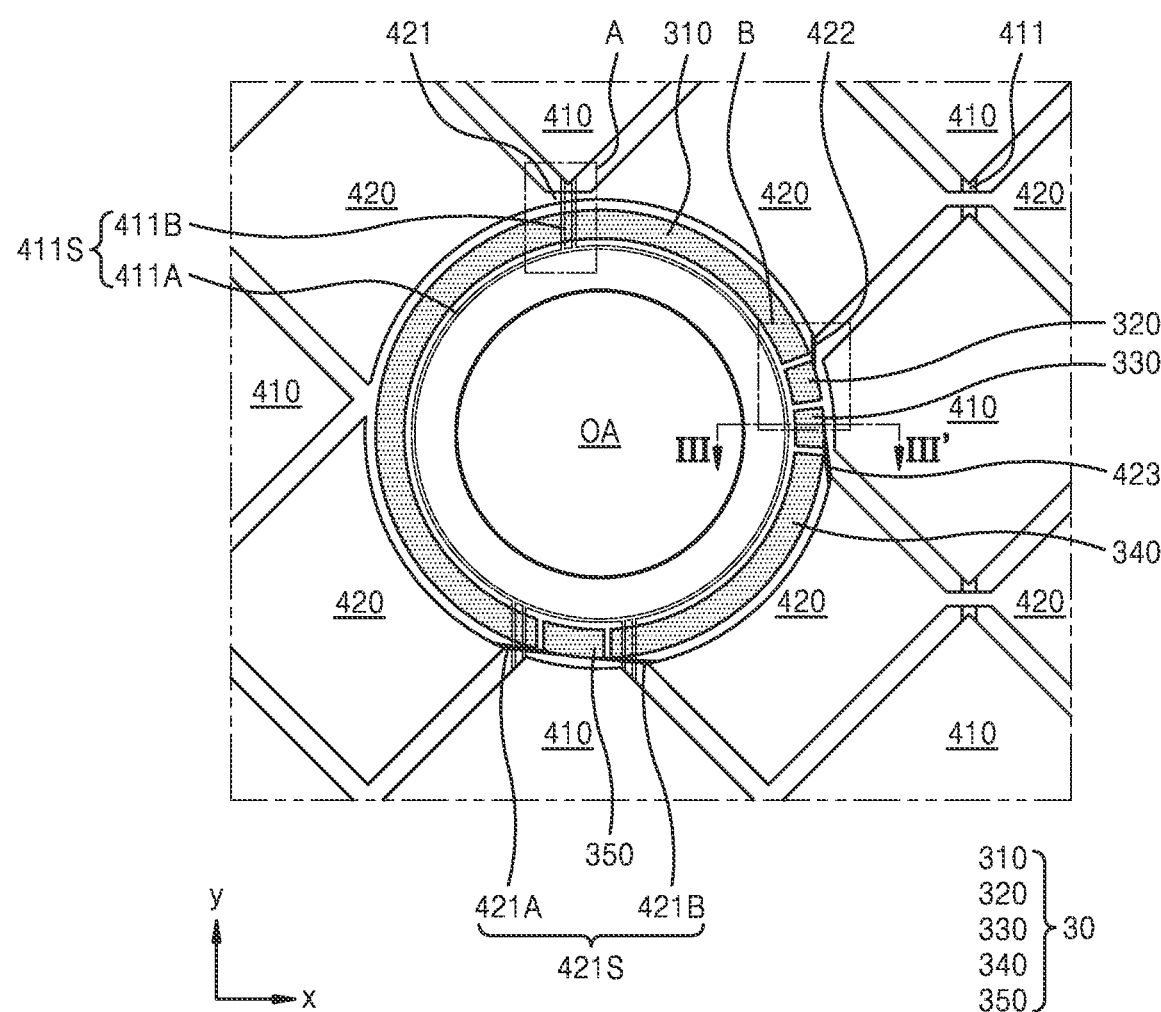
FIG. 10 is an enlarged plan view of a neighborhood of an opening area of a display device according to an embodiment.
Figure 11:
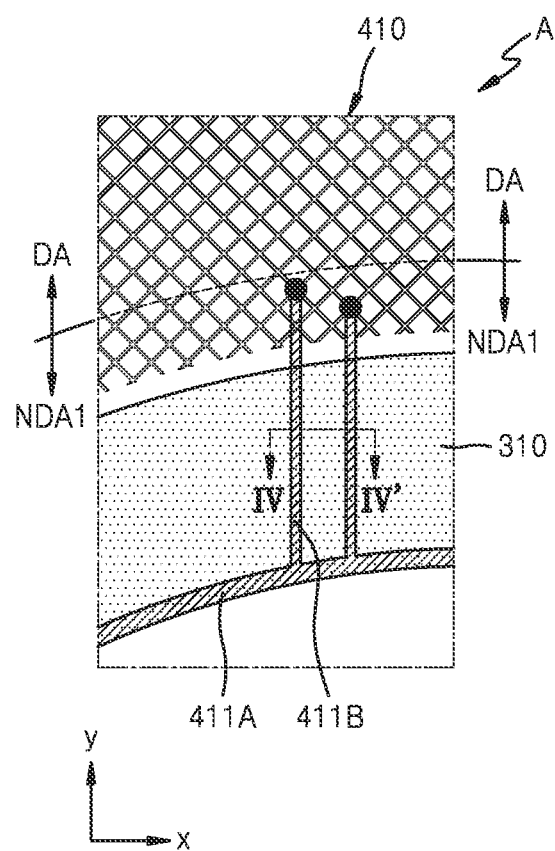
FIG. 11 is an enlarged plan view of a region "A" of FIG. 10.
Figure 12:
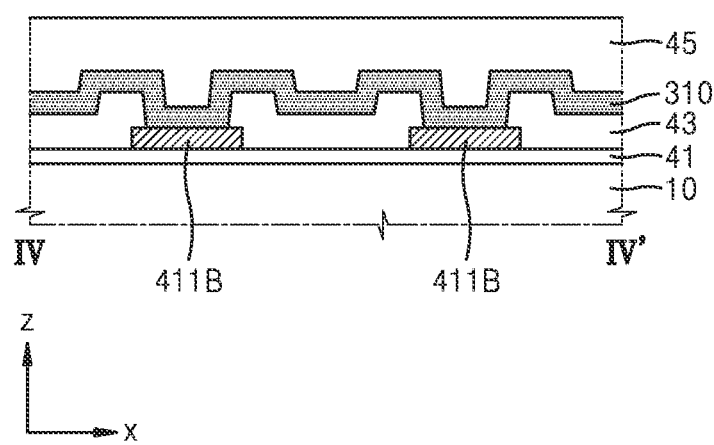
FIG. 12 is a cross-sectional view taken along line IV-IV' of FIG. 11.
Figure 13:
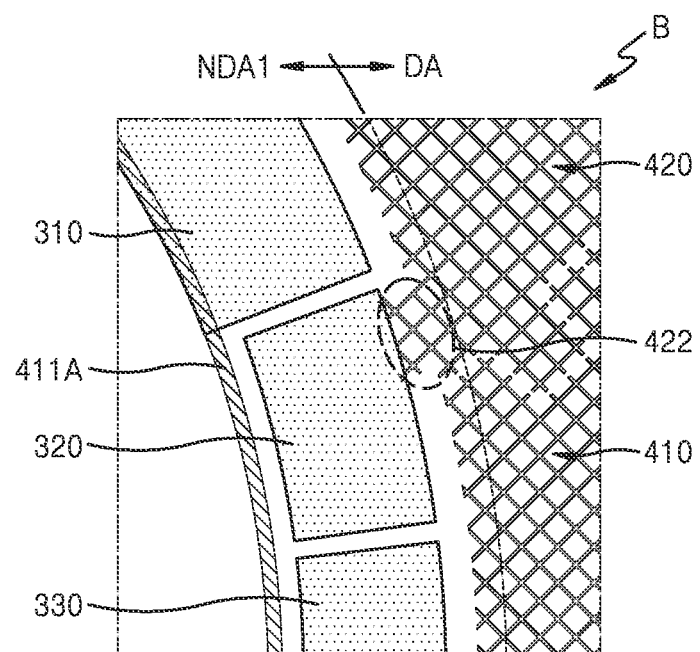
FIG. 13 is an enlarged plan view of a region "B" of FIG. 10.

FIG. 10 is an enlarged plan view of a neighborhood of the opening area OA of the display device 1 according to an embodiment; FIG. 11 is an enlarged plan view of a region "A" of FIG. 10; FIG. 12 is a cross-sectional view taken along the line IV-IV' of FIG. 11; and FIG. 13 is an enlarged plan view of a region "B" of FIG. 10.

Referring to FIG. 10, the metal layer 30 may include the first to fifth regions 310, 320, 330, 340, and 350. The first to fifth regions 310, 320, 330, 340, and 350 may be spaced apart from each other by an interval (e.g., a predetermined interval) to surround the opening area OA. As described above, the metal layer 30 may be located on a same layer as a layer on which one of the first and second conductive layers CML1 and CML2 provided to the input sensing layer 40 (see FIG. 8) is arranged, and may include a same material as that of one of the first and second conductive layers CML1 and CML2. Herein, description is made with respect to a case in which the metal layer 30 is located on a same layer on which the second conductive layer CML2 is arranged and includes a same material as that of the second conductive layer CML2.

The first sensing electrodes 410 may be spaced apart from each other around the opening area OA, and the second sensing electrodes 420 may be spaced apart from each other. The first sensing electrodes 410 that neighbor each other and are spaced apart from each other around the opening area OA may be electrically connected to each other by using a first sub-connection electrode 411S. The second sensing electrodes 420 that neighbor each other and are spaced apart from each other around the opening area OA may be electrically connected to each other by using the second connection electrode 421 or a second sub-connection electrode 421S and/or one of regions.

For example, as shown in FIG. 10, the first sensing electrodes 410 that neighbor each other and are respectively arranged up and down around the opening area OA may be electrically connected to each other by the first sub-connection electrode 411S. The first sub-connection electrode 411S is a modified element of the first connection electrode 411 and may be included in the first conductive layer CML1 shown in FIG. 8.

In an embodiment, the first sub-connection electrode 411S may include a first electrode 411A having a circular band (ring) shape and arranged in a circumferential direction surrounding the opening area OA, and a second electrode 411B protruding from the first electrode 411A, having a line shape, and contacting the first sensing electrode 410. In an embodiment, the first electrode 411A and the second electrode 411B may be formed as one body. The number of second electrodes 411B connected to the first sensing electrode 410 may be one or more. In an embodiment, the first sensing electrode 410 arranged above the opening area OA may be connected to the first sub-connection electrode 411S by contacting two second electrodes 411B. In an embodiment, the first sensing electrode 410 arranged below the opening area OA may be connected to the first sub-connection electrode 411S by contacting two second electrodes 411B on the left and two second electrodes 411B on the right. Since the second electrode 411B and the first electrode 411A are connected to each other, the first sensing electrodes 410 respectively arranged above and below the opening area OA may be electrically connected to each other.

The second sensing electrodes 420 that neighbor each other and are arranged on the upper right and the upper left of the opening area OA may be electrically connected to each other by the second connection electrode 421. The second sensing electrodes 420 and the second connection electrode 421 may be included in the second conductive layer CML2 as described above.

The second sensing electrodes 420 that neighbor each other and are arranged on the lower right and the lower left of the opening area OA may be electrically connected to each other by the second sub-connection electrode 421S and the fifth region 350. The second sub-connection electrode 421S is a modified element of the second connection electrode 421 and may be included in the second conductive layer CML2 shown in FIG. 8. The second sub-connection electrode 421S may include a first electrode 421A connected to the second sensing electrode 420 arranged on the lower left and a second electrode 421B connected to the second sensing electrode 420 arranged on the lower right. The first electrode 421A and the second electrode 421B may be electrically connected to the fifth region 350. That is, in an embodiment, the second sensing electrode 420, the second sub-connection electrode 421S, and the fifth region 350 may be located on a same layer, may include a same material, and may be connected as one body.

At least one of the first to fifth regions 310, 320, 330, 340, and 350 may be electrically connected to the first sensing electrode 410 or the second sensing electrode 420. Each of the first to fifth regions 310, 320, 330, 340, and 350 may be electrically connected to a sensing electrode to which a voltage different from that of a sensing electrode that is adjacent thereto is applied. A region that is adjacent to the first sensing electrode 410 among the first to fifth regions 310, 320, 330, 340, and 350 may be electrically connected to the second sensing electrode 420 in the neighborhood. A region that is adjacent to the second sensing electrode 420 among the first to fifth regions 310, 320, 330, 340, and 350 may be electrically connected to the first sensing electrode 410 in the neighborhood.

It is shown in FIG. 10 that each of the first to fifth regions 310, 320, 330, 340, and 350 is connected to the first sensing electrode 410 or the second sensing electrode 420. The first region 310 is adjacent to three second sensing electrodes 420 that have a modified shape and are arranged on the upper right, the upper left, and the lower left around the opening area OA, and may be electrically connected to the first sensing electrode 410 in the neighborhood through the first sub-connection electrode 411S. The second region 320 and the third region 330 are adjacent to the first sensing electrode 410 that has a modified shape and is arranged on the right around the opening area OA, and may be electrically connected to the second sensing electrode 420 in the neighborhood through connection portions 422 and 423. The fourth region 340 is adjacent to the second sensing electrode 420 that has a modified shape and is arranged on the lower right around the opening area OA, and is electrically connected to the first sensing electrode 410 in the neighborhood through the first sub-connection electrode 411S. The fifth region 350 is adjacent to the first sensing electrode 410 that has a modified shape and is arranged below around the opening area OA, and is electrically connected to the second sensing electrode 420 in the neighborhood through the second sub-connection electrode 421S.

Referring to FIGS. 10 and 11, the first region 310 may at least partially overlap the first sub-connection electrode 411S and may be electrically connected to the first sub-connection electrode 411S. The first region 310 may overlap the first electrode 411A or the second electrode 411B, or overlap both the first electrode 411A and the second electrode 411B. Referring to FIG. 12, the first region 310 located on the same layer as a layer on which the second conductive layer CML2 (see FIG. 8) is arranged may contact at least a portion of the first sub-connection electrode 411S located on the same layer as a layer on which the first conductive layer CML1 (see FIG. 8) is arranged through a contact hole formed in the second insulating layer 43. The first region 310 electrically connected to the first sub-connection electrode 411S connecting the first sensing electrodes 410 may include a kind of the first sensing electrode 410.

Referring to FIGS. 10 and 13, the second region 320 may be electrically connected to the second sensing electrode 420 by contacting one of the second sensing electrodes 420 through the connection portion 422. For example, as shown in FIG. 10, the second sensing electrode 420 on the upper right of the opening area OA, the connection portion 422, and the second region 320 may be located on the same layer as a layer on which the second conductive layer CML2 (see FIG. 8) is arranged, and may be formed as one body. The second region 320 may include a kind of the second sensing electrode 420.

The third region 330 may be electrically connected to the second sensing electrode 420 by contacting one of the second sensing electrodes 420 through the connection portion 423. For example, as shown in FIG. 10, the second sensing electrode 420 on the lower right of the opening area OA, the connection portion 423, and the third region 330 may be located on a same layer as a layer on which the second conductive layer CML2 (see FIG. 8) is arranged, and may be formed as one body. The third region 330 may include a kind of the second sensing electrode 420.

Similar to the first region 310, the fourth region 340 may be electrically connected to the first sub-connection electrode 411S. In an embodiment, electrical connection of the fourth region 340 and the first sub-connection electrode 411S is the same as the structure described with reference to FIGS. 11 and 12. Similar to the first region 310, the fourth region 340 may include a kind of the first sensing electrode 410.

The fifth region 350 may be connected to the second sensing electrodes 420 that neighbor each other by the second sub-connection electrode 421S. For example, as shown in FIG. 10, the fifth region 350 may be connected to the second sensing electrode 420 on the lower left of the opening area OA by the first electrode 421A, and connected to the second sensing electrode 420 on the lower right of the opening area OA by the second electrode 421B. In an embodiment, the second sensing electrodes 420, the second sub-connection electrode 421S, and the fifth region 350 may be formed on a same layer, for example, the same layer as a layer on which the second conductive layer CML2 (see FIG. 8) is arranged. The fifth region 350 may be understood as a kind of the second sensing electrode 420 or the second connection electrode.

FIG. 11 shows a portion of the first region 310 arranged in the first non-display area NDA1. The first sensing electrode 410 having a grid/lattice structure is arranged in the display area DA over the first non-display area NDA1. As shown in FIG. 11, a portion of the first sensing electrode 410 may be located in the first non-display area NDA1.

FIG. 13 shows a portion of the first region 310 arranged in the first non-display area NDA1, and the second region 320, and a portion of the third region 330. The first sensing electrode 410 and the second sensing electrode 420 having a grid/lattice structure are arranged in the display area DA on the right of the first non-display area NDA1. As shown in FIG. 13, a portion of the first sensing electrode 410 and the second sensing electrode 420 may be located in the first non-display area NDA1. Regions electrically connected to the second sensing electrode 420, for example, the second region 320, the third region 330, and the fifth region 350 do not overlap the first electrode 411A of the first sub-connection electrode 411S.

Although it is shown in FIG. 10 that areas of two first sensing electrodes 410 and four second sensing electrodes 420 are different from areas of the other sensing electrodes due to the opening area OA, the present disclosure is not limited thereto. The arrangement of the first and second sensing electrodes 410 and 420 around the opening area OA may be varied, and the areas of the first and second sensing electrodes 410 and 420 may be varied depending on a location and/or a size of the opening area OA. A touch sensitivity or sensing sensitivity around the opening area OA may be remarkably reduced depending on the location and/or the size of the opening area OA. As described above, in the case in which at least a portion of the first to fifth regions 310, 320, 330, 340, and 350 of the metal layer 30 is connected to the first sensing electrode 410 or the second sensing electrode 420, the region(s) may perform a function of the sensing electrode and may improve the touch sensitivity around the opening area OA.

Although it is shown in FIG. 10 that the areas (or sizes) of the first to fifth regions 310, 320, 330, 340, and 350 of the metal layer 30 are different, the present disclosure is not limited thereto. In another embodiment, the areas (or sizes) of the first to fifth regions 310, 320, 330, 340, and 350 may be the same. The areas or sizes of the first to fifth regions 310, 320, 330, 340, and 350 may be determined depending on the location and/or the size of the opening area OA. Depending on the location and/or the size of the opening area OA, the number of the regions of the metal layer 30 may be varied. Although it is shown in FIG. 10 that the first and fourth regions 310 and 340 connected to the first sensing electrode 410 are respectively adjacent to the second sensing electrodes 420, and the second, third, and fifth regions 320, 330, and 350 connected to the second sensing electrode 420 are respectively adjacent to the first sensing electrodes 410, the present disclosure is not limited thereto. In another embodiment, the electrical connection and arrangement of the regions may be varied as described below with reference to FIG. 14.

Figure 14:
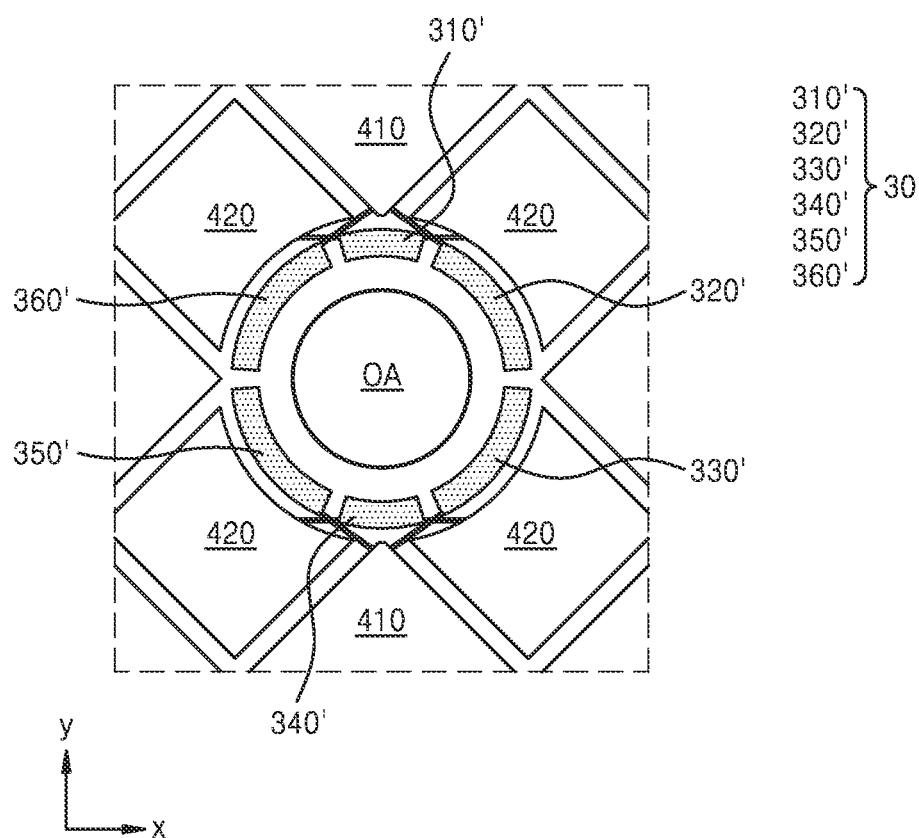
FIG. 14 is a conceptual view of a metal layer and sensing electrodes of a display device according to another embodiment.

FIG. 14 is a conceptual view of the metal layer 30 and the sensing electrodes of the display device 1 according to another embodiment. It is shown in FIG. 14 that the metal layer 30 includes six regions.

Referring to FIG. 14, each of first to sixth regions 310', 320', 330', 340', 350', and 360' may be electrically connected to a sensing electrode to which a voltage different from that of a sensing electrode that is adjacent thereto is applied. For example, each of the first and fourth regions 310' and 340' may be electrically connected to the second sensing electrode 420. The second, third, fifth, and sixth regions 320', 330', 350', and 360' may be electrically connected to the first sensing electrode 410. That is, a region arranged between the opening area OA and one of the sensing electrodes may receive a voltage different from that of the one of the sensing electrodes.

As shown in FIGS. 10 and 14, areas or sizes of sensing electrodes adjacent to the opening area OA may be different from each other. For example, an area or a size of the second sensing electrode 420 may be greater than an area or a size of the first sensing electrode 410. It is shown in FIG. 14 that an area or a size of a region adjacent to a sensing electrode having a relatively small area among electrodes around the opening area OA is greater than an area or a size of a region adjacent to a sensing electrode having a relatively large area among electrodes around the opening area OA. For example, referring to FIG. 10, areas or sizes of the first and fourth regions 310 and 340 adjacent to the second sensing electrode 420 having a relatively small area or size may be greater than areas or sizes of the second, third, and fifth regions 320, 330, and 350 adjacent to the first sensing electrode 410 having a relatively large area or size. For example, referring to FIG. 14, an area or a size of the second region 320' adjacent to the second sensing electrode 420 having a relatively small area or size may be greater than an area or size of the first region 310' adjacent to the first sensing electrode 410 having a relatively large area or size. However, the present disclosure is not limited thereto. In another embodiment, an area or a size of the second region adjacent to the second sensing electrode 420 having a relatively small area or size may be less than an area or a size of the first region adjacent to the first sensing electrode 410 having a relatively large area or size. Although FIG. 14 does not show separately, sensing electrodes spaced apart from each other around the opening area OA may be connected to each other to constitute a row or a column. For example, the first sensing electrodes 410 over and below the opening area OA may be connected to each other by the first sub-connection electrodes 411S described above with reference to FIG. 10. Likewise, the second sensing electrodes 420 on the lower right and the lower left of the opening area OA may be connected to each other by the second sub-connection electrodes 421S described with reference to FIG. 10, and the second sensing electrodes 420 on the upper right and the upper left of the opening area OA may be connected to each other by an electrode (not shown) similar to the second sub-connection electrodes 421S.

Figure 15A:
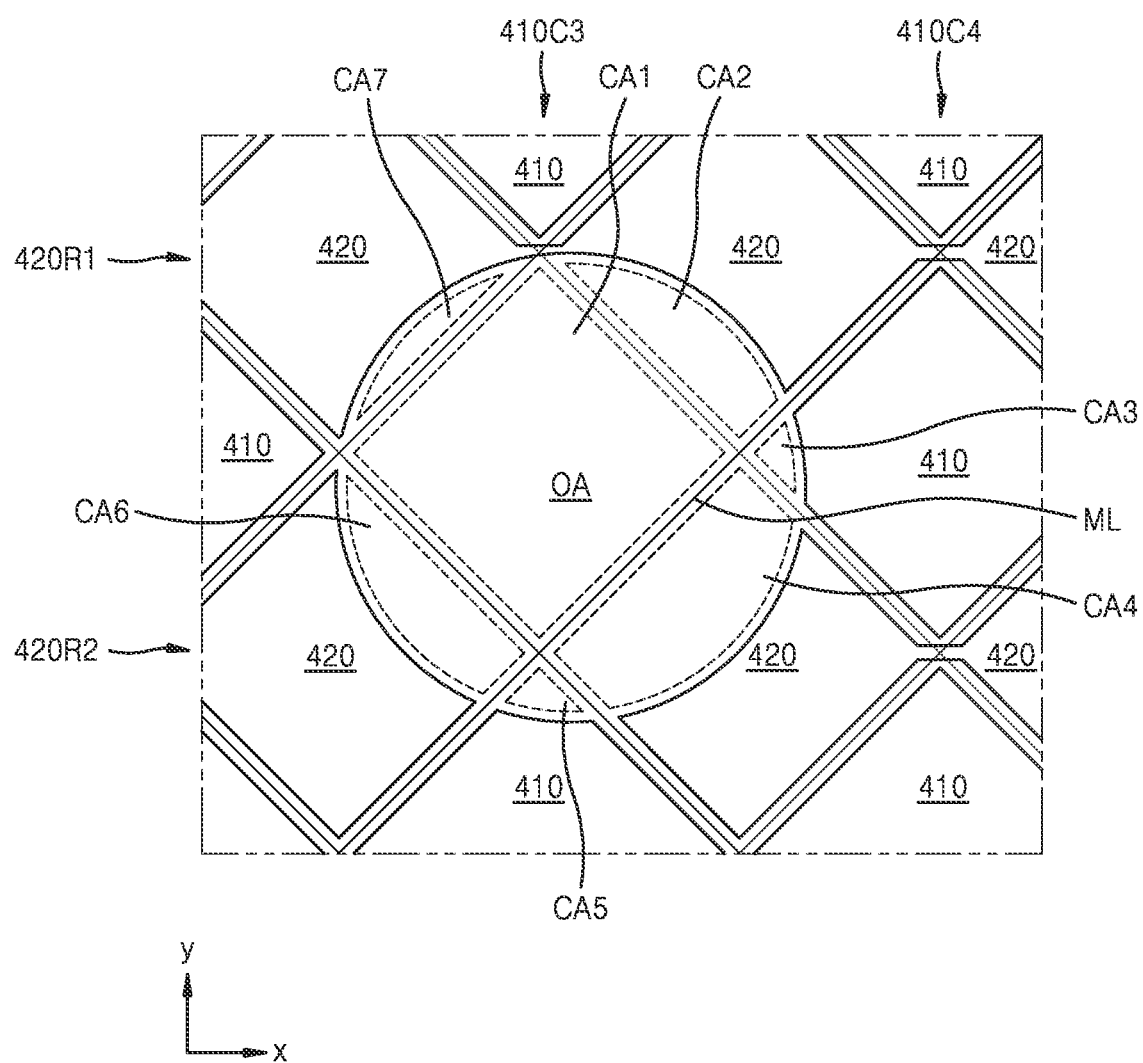
FIGS. 15A and 15B are views for explaining an area or a size of a metal layer according to an embodiment.
Figure 15B:
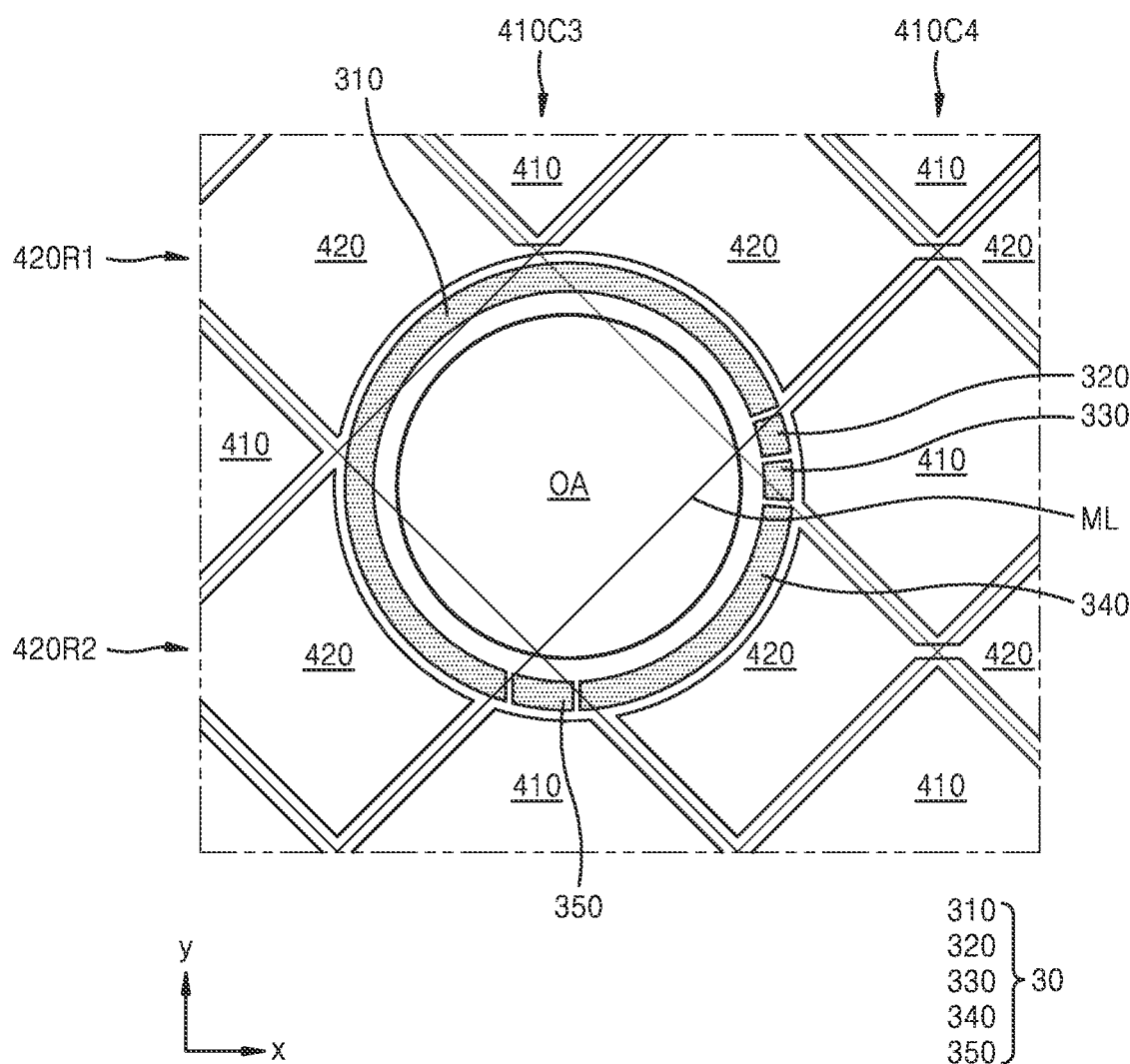

FIGS. 15A and 15B are views for explaining an area or a size of the metal layer 30 according to an embodiment.

Referring to FIG. 15A, the first sensing electrode 410 and the second sensing electrode 420 may be arranged to correspond to a virtual lattice line ML. All or some (CA1, CA2, CA3, CA4, CA5, CA6, and CA7) of the first sensing electrode 410 and the second sensing electrode 420 arranged in the opening area OA and the first non-display area NDA1 may be removed. In an example of FIG. 15A, the opening area OA is located in an intersection region of first sensing lines 410C3 and 410C4 and second sensing lines 420R1 and 420R2.

Referring to FIG. 15B, the metal layer 30 may be arranged in the first non-display area NDA1 in which all or some (CA1, CA2, CA3, CA4, CA5, CA6, and CA7) of the first sensing electrode 410 and the second sensing electrode 420 have been removed, the metal layer 30 surrounding the opening area OA. The metal layer 30 may include the regions 310, 320, 330, 340, and 350 having an area or a size corresponding to an electrode area removed from the first sensing electrode 410 or the second sensing electrode 420. For example, when an electrode area removed from the first sensing electrode 410 or the second sensing electrode 420 is large, an area or a size of a region of the metal layer 30 adjacent to the first sensing electrode 410 or the second sensing electrode 420 may be large.

Although not shown, the second, third, and fifth regions 320, 330, and 350 adjacent to the first sensing electrode 410 which has been partially removed may be electrically connected to the second sensing electrode 420 around the opening area OA. The first and fourth regions 310 and 340 adjacent to the second sensing electrode 420 which has been partially removed may be electrically connected to the first sensing electrode 410 around the opening area OA.

FIGS. 15A and 15B show an example in which an area or a size of the metal layer 30 is determined depending on a location and/or a size of the opening area OA, but embodiments are not limited thereto.

Figure 16:
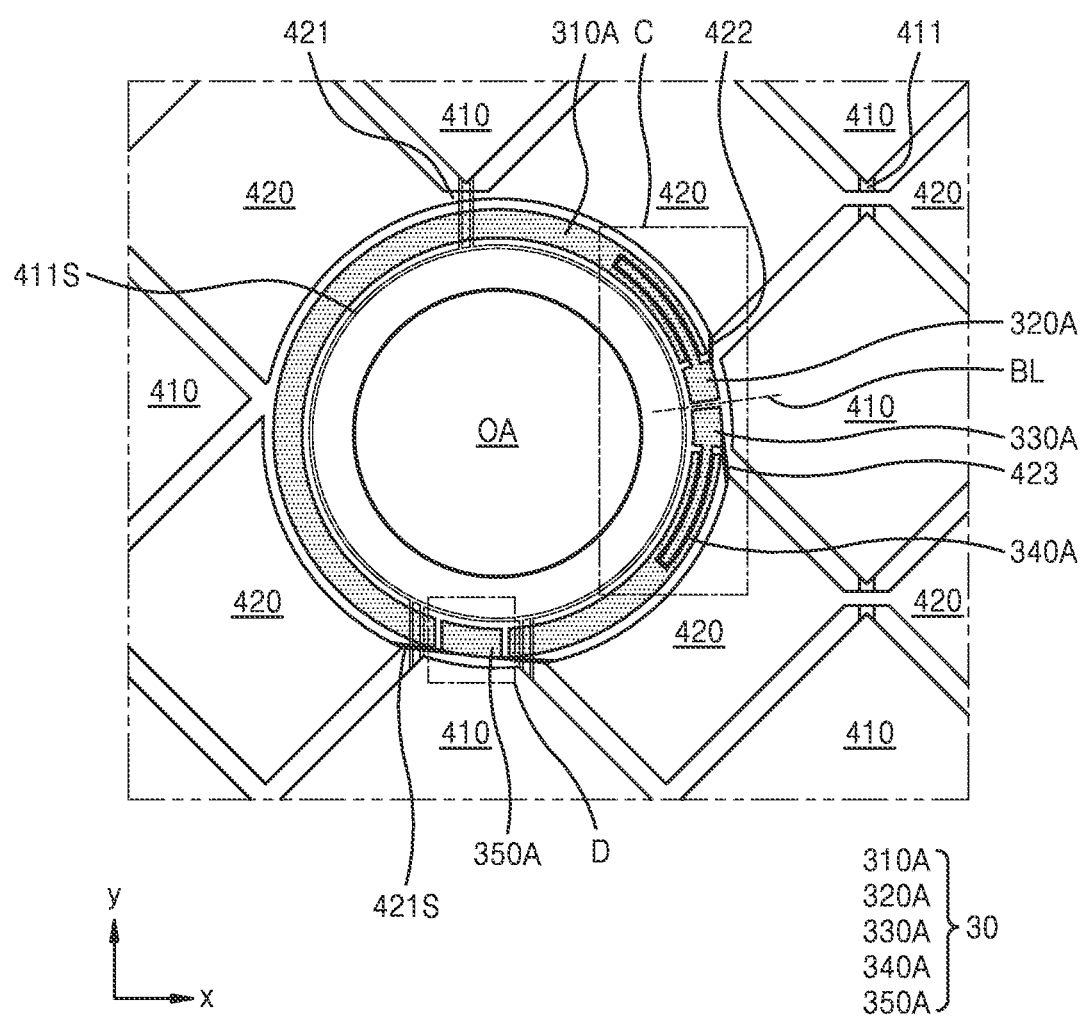
FIG. 16 is an enlarged plan view of a neighborhood of an opening area of a display device according to another embodiment.
Figure 17:
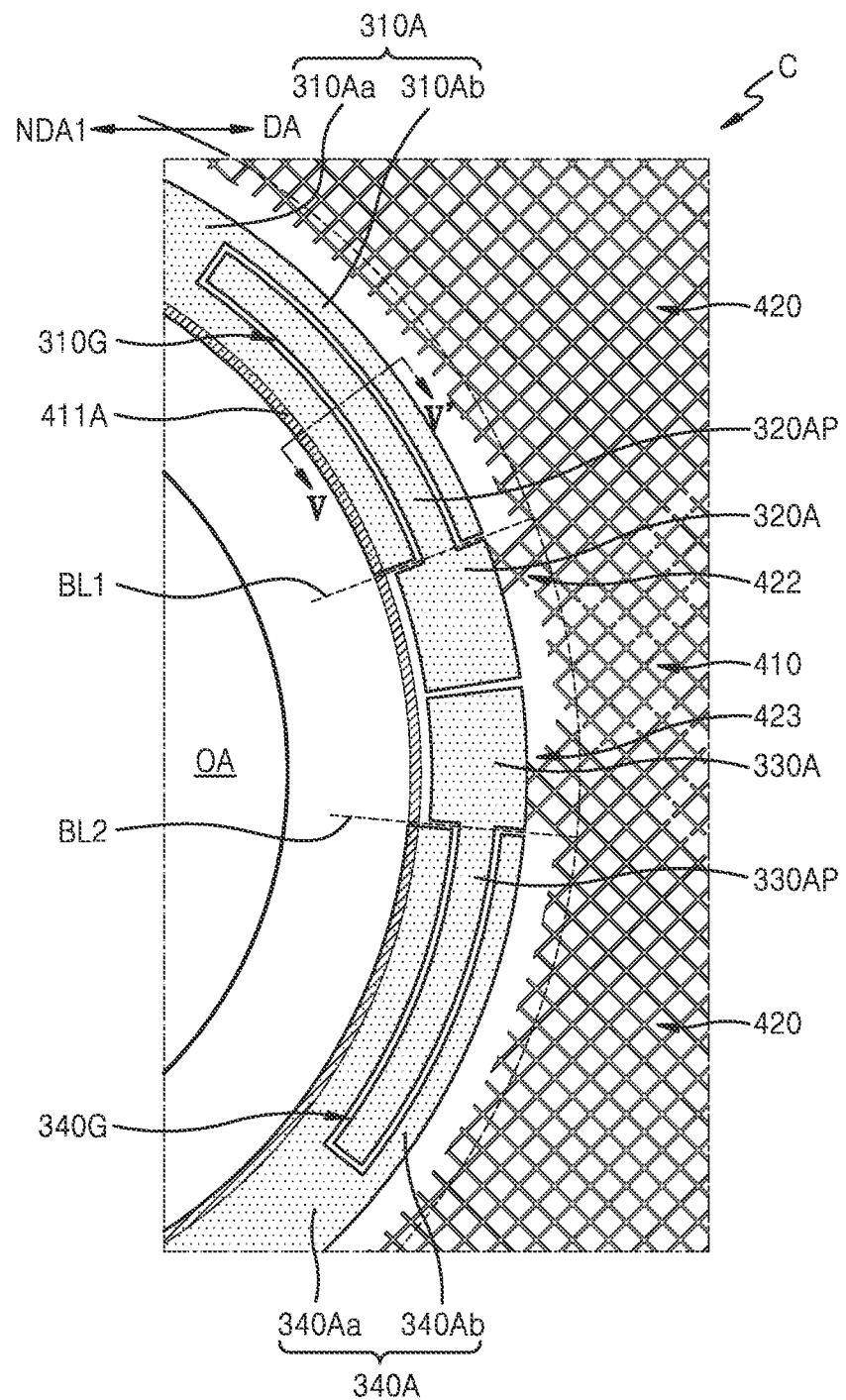
FIG. 17 is an enlarged plan view of a region "C" of FIG. 16.
Figure 18:
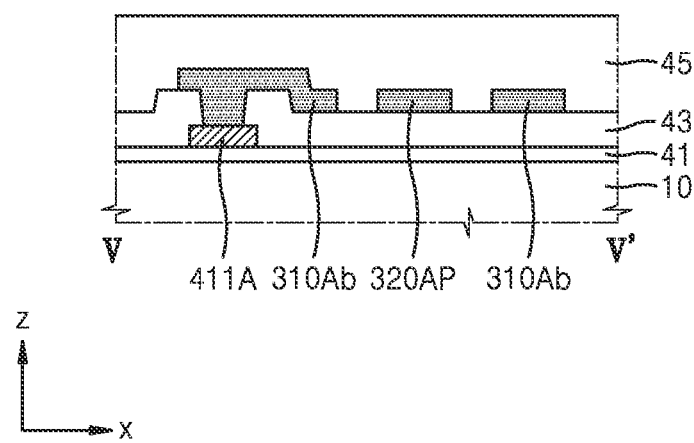
FIG. 18 is a cross-sectional view taken along the line V-V of FIG. 17.
Figure 19:
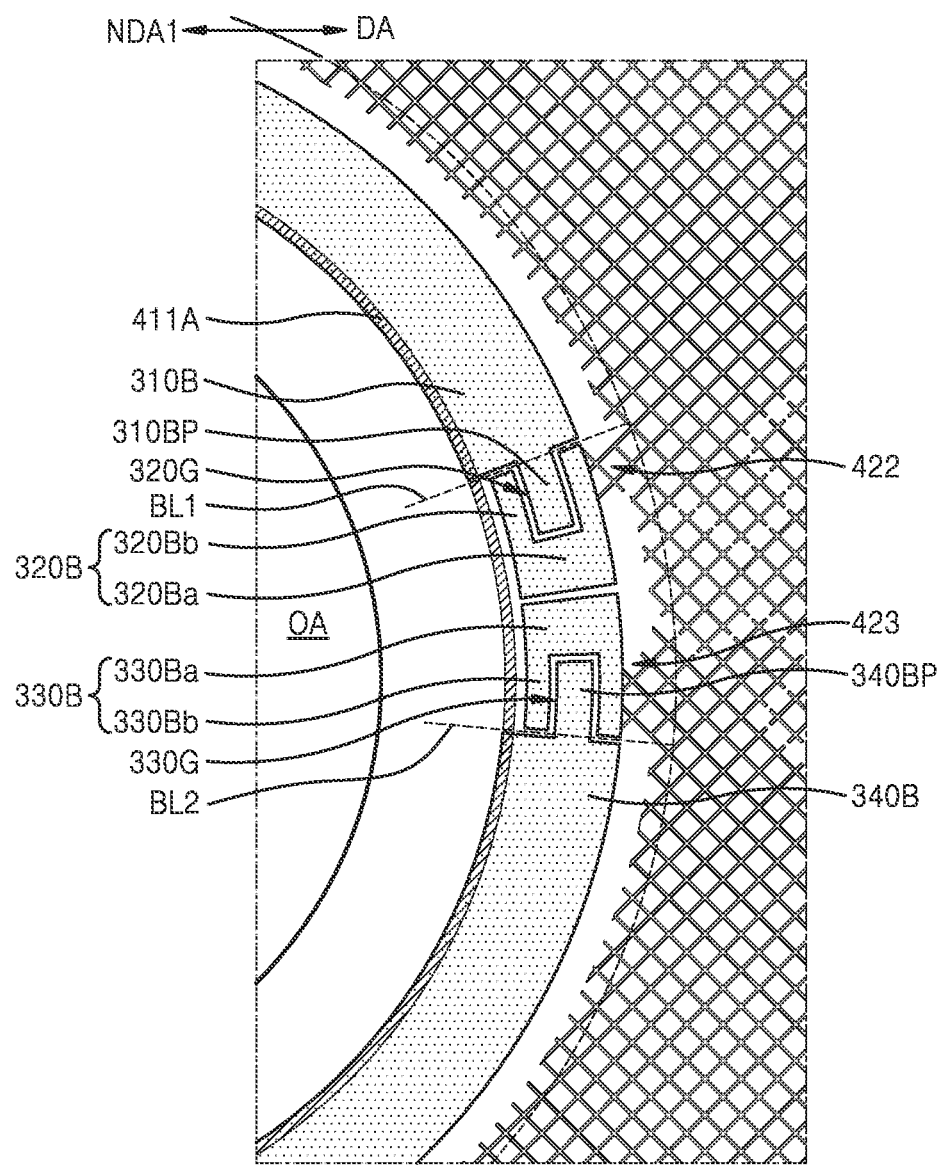
FIG. 19 is an enlarged plan view of a region corresponding to the region "C" of FIG. 16, according to an embodiment.

FIG. 16 is an enlarged plan view of a neighborhood of the opening area OA of the display device 1 according to another embodiment; FIG. 17 is an enlarged plan view of a region "C" of FIG. 16; FIG. 18 is a cross-sectional view taken along the line V-V of FIG. 17; and FIG. 19 is an enlarged plan view of a region corresponding to the region "C" of FIG. 16, according to an embodiment.

Referring to FIG. 16, in an embodiment, the metal layer 30 includes first to fifth regions 310A, 320A, 330A, 340A, and 350A. The first to fifth regions 310A, 320A, 330A, 340A, and 350A may be spaced apart from each other by an interval (e.g., a predetermined interval) to surround the opening area OA. The embodiment shown in FIG. 16 is different from the embodiment shown in FIG. 10 in that some of the first to fifth regions 310A, 320A, 330A, 340A, and 350A have been transformed to include a protrusion passing through a virtual boundary line or a shape receiving the protrusion. A virtual boundary line BL (referred to as a boundary line BL, herein) is defined as a central line passing through a separated space between sides facing each other with the facing sides of a pair of regions of the metal layer 30 adjacent to each other being continuously parallel in a straight line. That is, distances between the facing sides and the central line are the same. Herein, further detailed description of the same construction as that shown in FIGS. 10 to 13 is omitted.

Referring to FIG. 17, the second region 320A may include a protrusion 320AP extending toward the first region 310A beyond a boundary line BL1. The first region 310A may have an uneven shape including a groove 310G receiving the protrusion 320AP of the second region 320A. The third region 330A may include a protrusion 330AP extending toward the fourth region 340A beyond a boundary line BL2. The fourth region 340A may have an uneven shape including a groove 340G receiving the protrusion 330AP of the third region 330A.

The first region 310A may include a first portion 310Aa defined by the groove 310G having a U-shape, and a second portion 310Ab protruding in a comb teeth or fork shape from the first portion 310Aa. The protrusion 320AP of the second region 320A may be received in the groove 310G of the first region 310A. The protrusion 320AP of the second region 320A may be surrounded by the second portion 310Ab of the first region 310A. The second portion 310Ab of the first region 310A and the protrusion 320AP of the second region 320A may be spaced apart from each other by an interval (e.g., a predetermined interval) so as not to overlap each other in a plan view in a radial direction from a center of the opening area OA. A portion of the second portion 310Ab of the first region 310A may be adjacent to the second sensing electrode 420. When a length of facing sides of the first region 310A electrically connected to the first sensing electrode 410 and the second region 320A electrically connected to the second sensing electrode 420 increases, a touch sensitivity in the first non-display area NDA1 may be improved.

Referring to FIG. 18, in an embodiment, the second portion 310Ab of the first region 310A located on a same layer as a layer on which the second conductive layer CML2 (see FIG. 8) is arranged may be electrically connected to the first electrode 411A of the first sub-connection electrode 411S by contacting, through a contact hole formed in the second insulating layer 43, the first electrode 411A located on a same layer as a layer on which the first conductive layer CML1 (see FIG. 8) is arranged. The protrusion 320AP of the second region 320A may be located on a same layer as a layer on which the second conductive layer CML2 (see FIG. 8) is arranged and may be located between the second portions 310Ab of the first region 310A.

The fourth region 340A may include a first portion 340Aa defined by the groove 340G having a U-shape, and a second portion 340Ab protruding in a comb teeth or fork shape from the first portion 340Aa. The protrusion 330AP of the third region 330A may be received in the groove 340G of the fourth region 340A. The protrusion 330AP of the third region 330A may be surrounded by the second portion 340Ab of the fourth region 340A. The second portion 340Ab of the fourth region 340A and the protrusion 330AP of the third region 330A may be spaced apart from each other by an interval (e.g., a predetermined interval) so as not to overlap each other in a plan view in a radial direction from a center of the opening area OA. A portion of the second portion 340Ab of the fourth region 340A may be adjacent to the second sensing electrode 420. When a length of facing sides of the fourth region 340A electrically connected to the first sensing electrode 410 and the third region 330A electrically connected to the second sensing electrode 420 increases, a touch sensitivity in the first non-display area NDA1 may be improved.

FIGS. 16 and 17 show that one groove 310G and 340G is respectively formed in each of the first region 310A and the fourth region 340A. In another embodiment, one or more grooves may be formed in the first region 310A and the fourth region 340A. A shape and/or a size of one or more grooves may be different. The number, a shape, and/or a size of grooves of the first region 310A and the fourth region 340A may be determined depending on the number, a shape, and/or a size of protrusions of each of the second region 320A and the third region 330A.

FIG. 17 shows an example in which the protrusions 320AP and 330AP respectively of the second region 320A and the third region 330A, each having a small area are respectively inserted into the grooves 310G and 340G respectively of the first region 310A and the fourth region 340A, each having a relatively large area.

An embodiment of FIG. 19 includes an example in which protrusions 310BP and 340BP of a first region 310B and a fourth region 340B, respectively, each having a large area are inserted into grooves 320G and 330G, respectively, of a second region 320B and a third region 330B, each having a relatively small area. The first to fourth regions 310B, 320B, 330B, and 340B are modified examples of the first to fourth regions 310A, 320A, 330A, and 340A of FIG. 16.

Referring to FIG. 19, the first region 310B may include the protrusion 310BP extending toward the second region 320B beyond the boundary line BL1. The second region 320B may have an uneven shape including a groove 320G receiving the protrusion 310BP of the first region 310B. The fourth region 340B may include a protrusion 340BP extending toward the third region 330B beyond a boundary line BL2. The third region 330B may have an uneven shape including a groove 330G receiving the protrusion 340BP of the fourth region 340B. The second region 320B may include a first portion 320Ba defined by the groove 320G having a U-shape, and a second portion 320Bb protruding in a comb teeth or fork shape from the first portion 320Ba. The protrusion 310BP of the first region 310B may be received in the groove 320G of the second region 320B. The protrusion 310BP of the first region 310B may be surrounded by the second portion 320Bb of the second region 320B. The second portion 320Bb of the second region 320B and the protrusion 310BP of the first region 310B may be spaced apart from each other by an interval (e.g., a predetermined interval) so as not to overlap each other in a plan view in a radial direction from a center of the opening area OA. A portion of the second portion 320Bb of the second region 320B may be adjacent to the first sensing electrode 410. When a length of facing sides of the first region 310B electrically connected to the first sensing electrode 410 and the second region 320B electrically connected to the second sensing electrode 420 increases, a touch sensitivity in the first non-display area NDA1 may be improved.

The third region 330B may include a first portion 330Ba defined by the groove 330G having a U-shape, and a second portion 330Bb protruding in a comb teeth or fork shape from the first portion 330Ba. The protrusion 340BP of the fourth region 340B may be received in the groove 330G of the third region 330B. The protrusion 340BP of the fourth region 340B may be surrounded by the second portion 330Bb of the third region 330B. The second portion 330Bb of the third region 330B and the protrusion 340BP of the fourth region 340B may be spaced apart from each other by an interval (e.g., a predetermined interval) so as not to overlap each other in a plan view in a radial direction from a center of the opening area OA. A portion of the second portion 330Bb of the third region 330B may be adjacent to the first sensing electrode 410. When a length of facing sides of the fourth region 340B electrically connected to the first sensing electrode 410 and the third region 330B electrically connected to the second sensing electrode 420 increases, a touch sensitivity in the first non-display area NDA1 may be improved.

Figure 20:
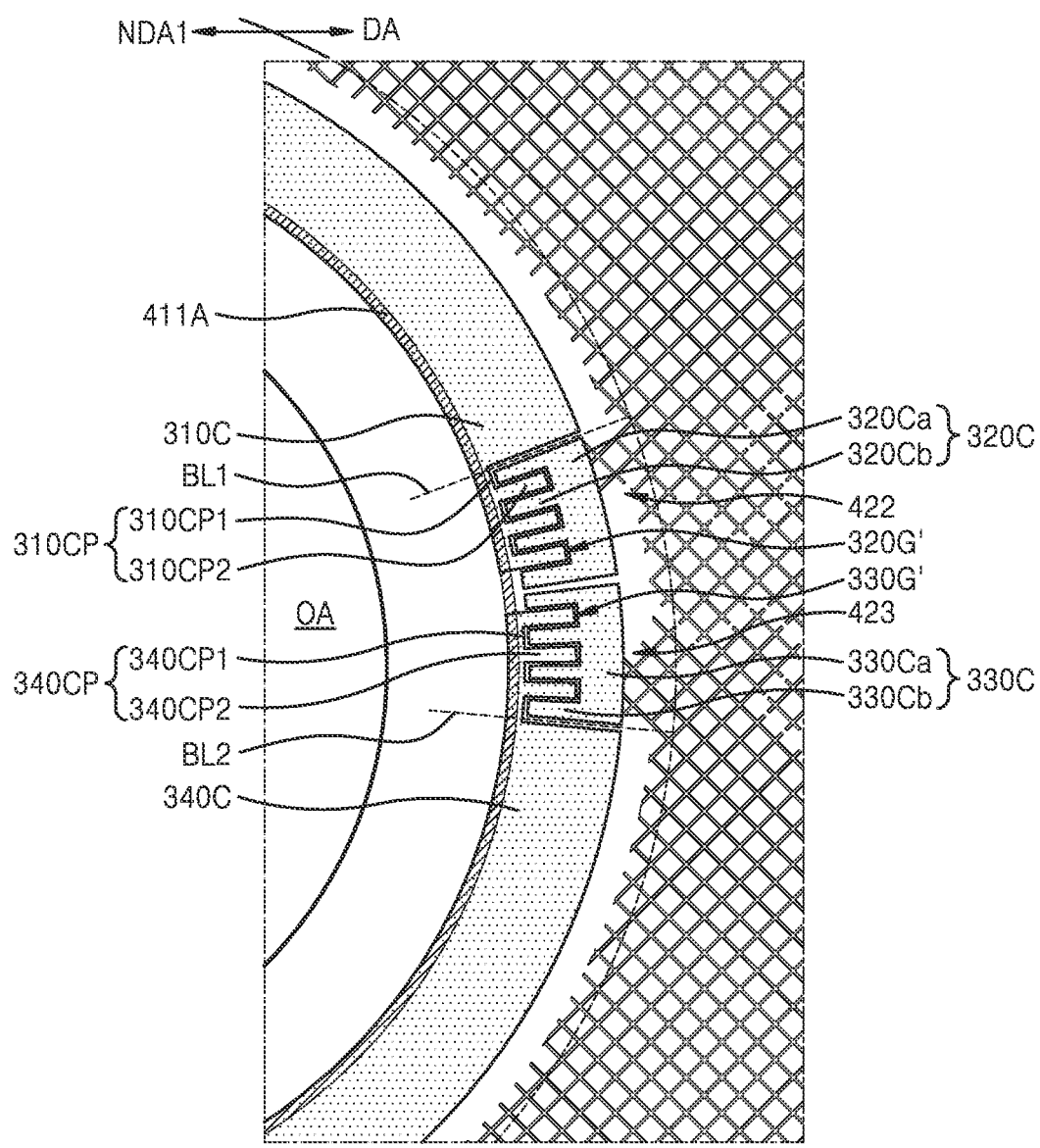
FIGS. 20 and 21 are enlarged plan views of a region corresponding to the region "C" of FIG. 16 according to embodiments.
Figure 21:
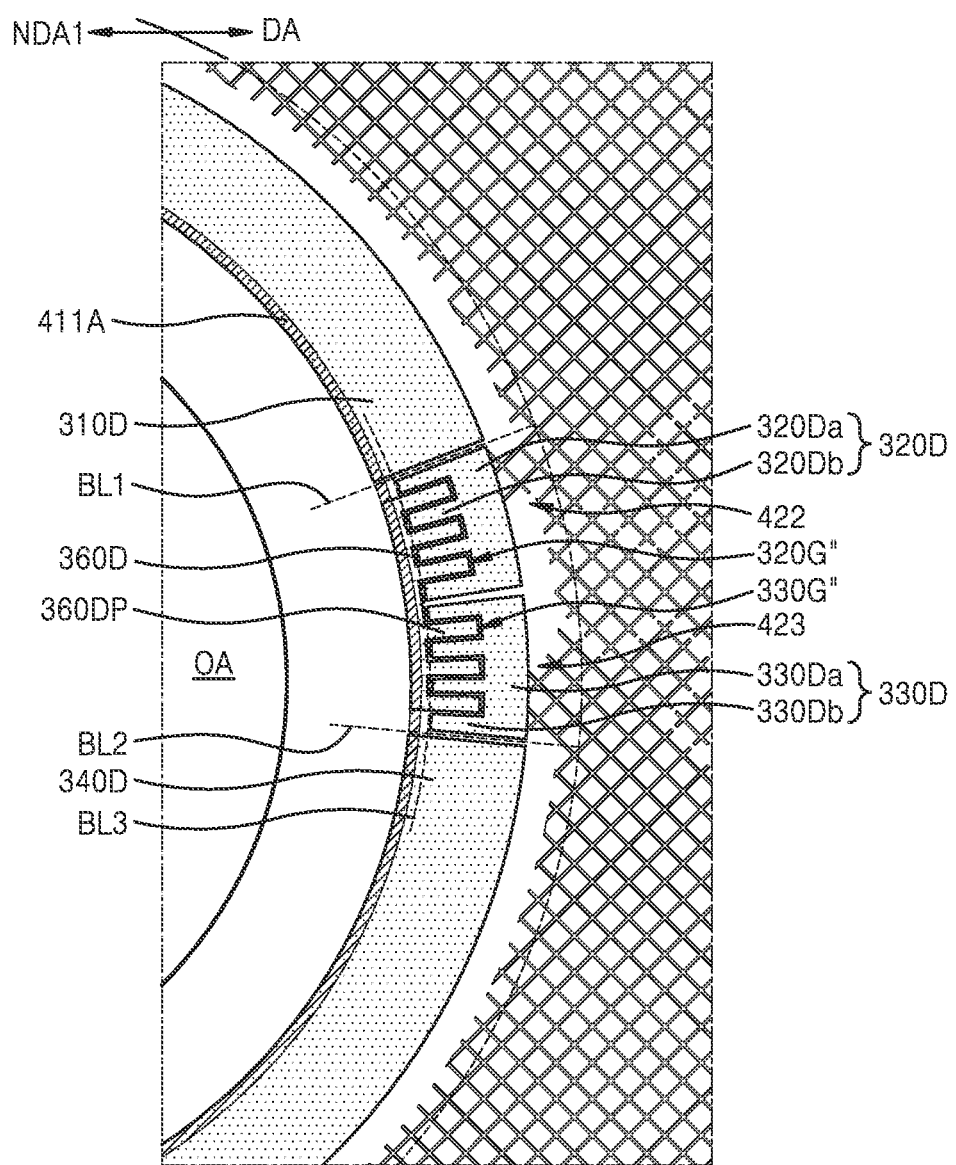

FIGS. 20 and 21 are enlarged plan views of a region corresponding to the region "C" of FIG. 16 according to embodiments.

Referring to FIG. 20, first to fourth regions 310C, 320C, 330C, and 340C are modified examples of the first to fourth regions 310A, 320A, 330A, and 340A of FIG. 16.

Referring to FIG. 20, the first region 310C may include a protrusion 310CP extending toward the second region 320C beyond the boundary line BL1. One side of the second region 320C may have an uneven shape including a groove 320G' receiving the protrusion 310CP of the first region 310C. The fourth region 340C may include a protrusion 340CP extending toward the third region 330C beyond a boundary line BL2. One side of the third region 330C may have an uneven shape including a groove 330G' receiving the protrusion 340CP of the fourth region 340C. The protrusion 310CP of the first region 310C may include a main portion 310CP1 overlapping the first electrode 411A of the first sub-connection electrode 411S, and a plurality of branches 310CP2 protruding toward the second region 320C from the main portion 310CP1. The main portion 310CP1 may be electrically connected to the first sub-connection electrode 411S by contacting the first electrode 411A of the first sub-connection electrode 411S.

The second region 320C may include a first portion 320Ca defined by a plurality of grooves 320G' having a U-shape and formed on a side facing the opening area OA, and a plurality of second portions 320Cb protruding toward a center of the opening area OA in a comb teeth or fork shape from the first portion 320Ca.

The plurality of branches 310CP2 of the first region 310C may be received in the plurality of grooves 320G' of the second region 320C. The plurality of branches 310CP2 of the first region 310C may be surrounded by the second portions 320Cb of the second region 320C. The second portions 320Cb of the second region 320C and the plurality of branches 310CP2 of the first region 310C may be spaced apart from each other by an interval (e.g., a predetermined interval) so as not to overlap each other in a plan view. The first portion 320Ca of the second region 320C may be adjacent to the first sensing electrode 410. When a length of facing sides of the first region 310C electrically connected to the first sensing electrode 410 and the second region 320C electrically connected to the second sensing electrode 420 increases, a touch sensitivity in the first non-display area NDA1 may be improved.

The protrusion 340CP of the fourth region 340C may include a main portion 340CP1 overlapping the first electrode 411A of the first sub-connection electrode 411S, and a plurality of branches 340CP2 protruding toward the third region 330C from the main portion 340CP1. The main portion 340CP1 may be electrically connected to the first sub-connection electrode 411S by contacting the first electrode 411A of the first sub-connection electrode 411S.

The third region 330C may include a first portion 330Ca defined by a plurality of grooves 330G' having a U-shape and formed on a side facing the opening area OA, and a plurality of second portions 330Cb protruding toward a center of the opening area OA in a comb teeth or fork shape from the first portion 330Ca.

The plurality of branches 340CP2 of the fourth region 340C may be received in the plurality of grooves 330G' of the third region 330C. The plurality of branches 340CP2 of the fourth region 340C may be surrounded by the second portions 330Cb of the third region 330C. The second portions 330Cb of the third region 330C and the plurality of branches 340CP2 of the fourth region 340C may be spaced apart from each other by an interval (e.g., a predetermined interval) so as not to overlap each other in a plan view. The first portion 330Ca of the third region 330C may be adjacent to the first sensing electrode 410. When a length of facing sides of the fourth region 340C electrically connected to the first sensing electrode 410 and the second region 330C electrically connected to the second sensing electrode 420 increases, a touch sensitivity in the first non-display area NDA1 may be improved.

Referring to FIG. 20, although the protrusion 310CP of the first region 310C and the protrusion 340CP of the fourth region 340C are electrically connected to each other, the protrusion 310CP and the protrusion 340CP are physically separated from each other. In another embodiment, the protrusion 310CP of the first region 310C and the protrusion 340CP of the fourth region 340C may be physically connected to each other. That is, the protrusion 310CP of the first region 310C and the protrusion 340CP of the fourth region 340C may be formed as one body.

Referring to FIG. 21, the metal layer 30 may include first to fourth regions 310D, 320D, 330D, 340D, a fifth region (not shown), and a sixth region 360D.

The second region 320D may include a first portion 320Da defined by a plurality of grooves 320G" having a U-shape and formed on a side facing the opening area OA, and a plurality of second portions 320Db protruding toward a center of the opening area OA in a comb teeth or fork shape from the first portion 320Da.

The third region 330D may include a first portion 330Da defined by a plurality of grooves 330G" having a U-shape and formed on a side facing the opening area OA, and a plurality of second portions 330Db protruding toward a center of the opening area OA in a comb teeth or fork shape from the first portion 330Da.

The sixth region 360D may be arranged between the second and third regions 320D and 330D and the opening area OA. The sixth region 360D may include a plurality of protrusions 360DP extending toward the second and third regions 320D and 330D beyond a boundary line BL3. The sixth region 360D may overlap the first electrode 411A of the first sub-connection electrode 411S. The sixth region 360D may be electrically connected to the first sub-connection electrode 411S by contacting the first electrode 411A of the first sub-connection electrode 411S. The protrusions 360DP of the sixth region 360D may be received in the grooves 320G" and 330G", respectively, of the second and third regions 320D and 330D. The protrusions 360DP of the sixth region 360D may be surrounded by the second portions 320Db and 330Db, respectively, of the second and third regions 320D and 330D.

When a length of facing sides of the sixth region 360D electrically connected to the first sensing electrode 410 and the second and third regions 320D and 330D electrically connected to the second sensing electrode 420 increases, a touch sensitivity in the first non-display area NDA1 may be improved.

Figure 22:
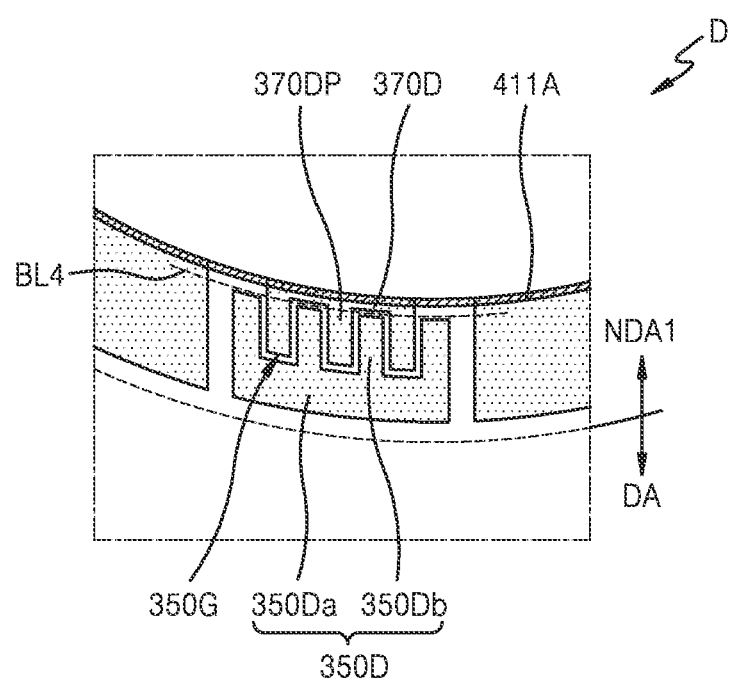
FIG. 22 is an enlarged plan view of a region "D" of FIG. 16 according to an embodiment.

FIG. 22 is an enlarged plan view of a region "D" of FIG. 16 according to another embodiment.

Referring to FIG. 22, the metal layer 30 may include the first to fourth regions (not shown), a fifth region 350D, and a seventh region 370D.

The fifth region 350D may include a first portion 350Da defined by a plurality of grooves 350G having a U-shape and formed on a side facing the opening area OA, and a plurality of second portions 350Db protruding toward a center of the opening area OA in a comb teeth or fork shape from the first portion 350Da.

The seventh region 370D may be arranged between the fifth region 350D and the opening area OA. The seventh region 370D may include a plurality of protrusions 370DP extending toward the fifth region 350D beyond a boundary line BL4. The seventh region 370D may overlap the first electrode 411A of the first sub-connection electrode 411S. The seventh region 370D may be electrically connected to the first sub-connection electrode 411S by contacting the first electrode 411A of the first sub-connection electrode 411S. The protrusions 370DP of the seventh region 370D may be received in the grooves 350G of the fifth region 350D. The protrusions 370DP of the seventh region 370D may be surrounded by the second portions 350Db of the fifth region 350D.

When a length of facing sides of the seventh region 370D electrically connected to the first sensing electrode 410 and the fifth region 350D electrically connected to the second sensing electrode 420 increases, a touch sensitivity in the first non-display area NDA1 may be improved.

In FIGS. 21 and 22, the first to fifth regions 310D, 320D, 330D, 340D, and 350D are modified examples of the first to fifth regions 310A, 320A, 330A, 340A, and 350A of FIG. 16.

FIGS. 23 to 27 are enlarged plan views of the metal layer 30 according to embodiments.

Herein, for convenience of description, a first region and a second region of the metal layer 30 that are adjacent to each other are described as an example. One of the first region and the second region may be electrically connected to the first sensing electrode 410, and the other of the first region and the second region may be electrically connected to the second sensing electrode 420.

Figure 23:
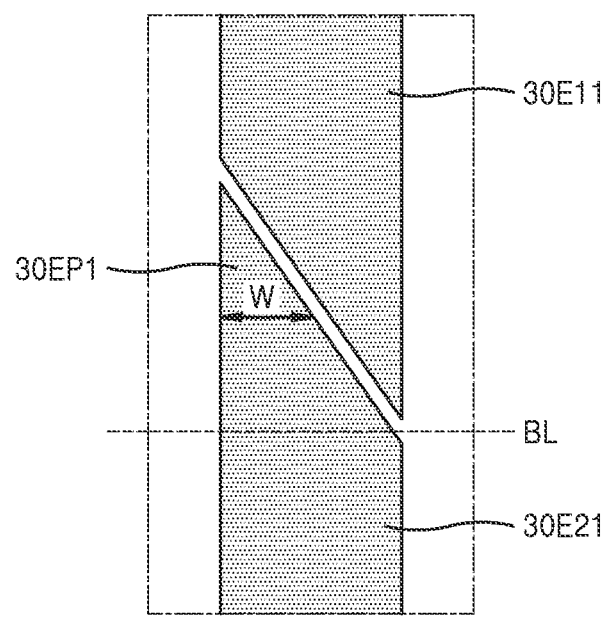
FIGS. 23 to 27 are enlarged plan views of a metal layer according to embodiments.

Referring to FIG. 23, a second region 30E21 may include a protrusion 30EP1 extending toward a first region 30E11 beyond a boundary line BL, and the first region 30E11 may have a shape receiving the protrusion 30EP1 of the second region 30E21. The protrusion 30EP1 of the second region 30E21 has a reducing width W away from the boundary line BL and has a side having an oblique line shape. A side of the first region 30E11 that faces the second region 30E21 may have an oblique line shape corresponding to the protrusion 30EP1 of the second region 30E21. Accordingly, the first region 30E11 and the second region 30E21 are alternately arranged in an oblique line, and a length of sides facing each other may be increased compared to a case in which sides parallel to the boundary line BL are provided.

Figure 24:
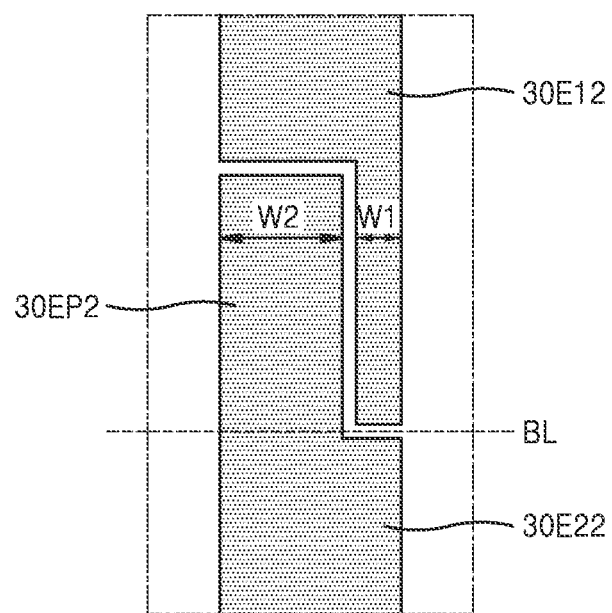

Referring to FIG. 24, a second region 30E22 may include a protrusion 30EP2 extending toward a first region 30E12 beyond a boundary line BL, and the first region 30E12 may have a shape receiving the protrusion 30EP2 of the second region 30E22. The protrusion 30EP2 of the second region 30E22 has a rectangular line shape and may be received in a space formed in a side of the first region 30E12. Accordingly, the first region 30E12 and the second region 30E22 are alternately arranged, and a length of sides facing each other may be increased compared to the case in which sides parallel to the boundary line BL are provided. In an embodiment, a width W2 of the protrusion 30EP2 of the second region 30E22 may be constant. The width W2 of the protrusion 30EP2 of the second region 30E22 may be equal to, greater than, or less than a width W1 of a corresponding portion of the first region 30E12. FIG. 24 shows an example in which the width W2 of the protrusion 30EP2 of the second region 30E22 is greater than the width W1 of the portion of the first region 30E12 corresponding to the protrusion 30EP2 of the second region 30E22.

Figure 25:
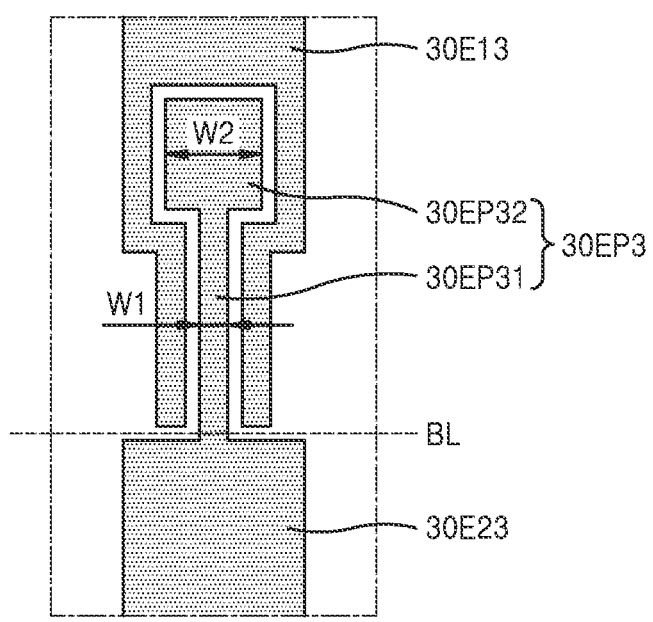

Referring to FIG. 25, a second region 30E23 may include a protrusion 30EP3 extending toward a first region 30E13 beyond a boundary line BL, and the first region 30E13 may have a shape receiving the protrusion 30EP3 of the second region 30E23. In an embodiment, the protrusion 30EP3 of the second region 30E23 may include a first portion 30EP31 having a rectangular line shape and a second portion 30EP32 having a square shape. A width W1 of the first portion 30EP31 may be less than a width W2 of the second portion 30EP32. The protrusion 30EP3 of the second region 30E23 may be received in a space formed in the first region 30E13. Accordingly, a length of facing sides of the first region 30E13 and the second region 30E23 may be increased compared to the case in which sides parallel to the boundary line BL are provided to the first region 30E13 and the second region 30E23.

Figure 26:
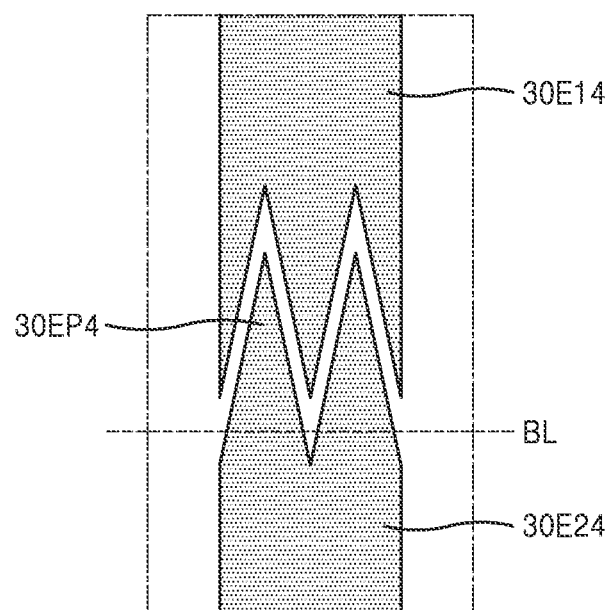

Referring to FIG. 26, a second region 30E24 may include a protrusion 30EP4 extending toward a first region 30E14 beyond a boundary line BL, and the first region 30E14 may have a shape receiving the protrusion 30EP4 of the second region 30E24. The protrusion 30EP4 of the second region 30E24 may have a sawtooth shape and may be received in a corresponding space of the first region 30E14. Accordingly, a length of facing sides of the first region 30E14 and the second region 30E24 may be increased compared to the case in which sides parallel to the boundary line BL are provided to the first region 30E14 and the second region 30E24.

Figure 27:
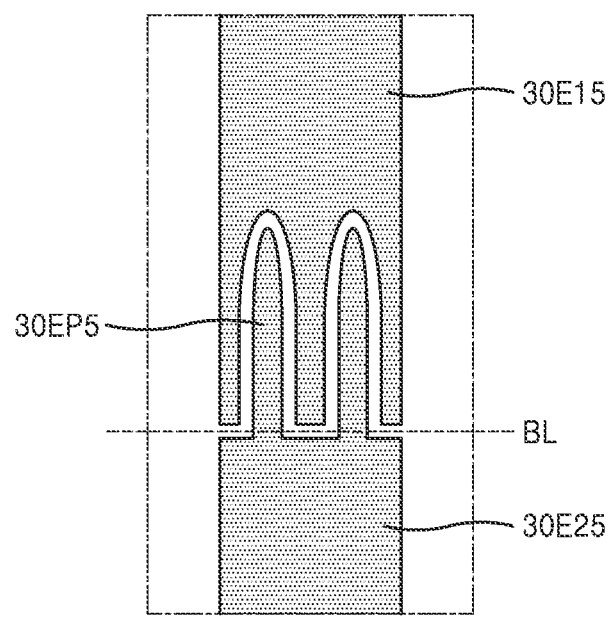

Referring to FIG. 27, a second region 30E25 may include a protrusion 30EP5 extending toward a first region 30E15 beyond a boundary line BL, and the first region 30E15 may have a shape receiving the protrusion 30EP5 of the second region 30E25. The protrusion 30EP5 of the second region 30E25 may have a rounded edge shape and may be received in a corresponding space of the first region 30E15. Accordingly, a length of facing sides of the first region 30E15 and the second region 30E25 may be increased compared to the case in which sides parallel to the boundary line BL are provided to the first region 30E15 and the second region 30E25.

FIGS. 23 to 27 are examples in which a second region having a relatively small area includes a protrusion protruding toward a first region having a large area. In another embodiment, the first region having a relatively large area may include a protrusion protruding toward the second region having a small area.

The above embodiments have been provided as examples, and a shape of the protrusion may be varied. In the embodiments, a pair of regions of the metal layer 30 that are adjacent to each other may have any of various shapes (e.g. a quadrangle, a triangle, a rounded shape, a sawtooth shape, or other arbitrary appropriate shapes) that are associated with each other without physically contacting each other while being electrically insulated from each other.

Figure 28:
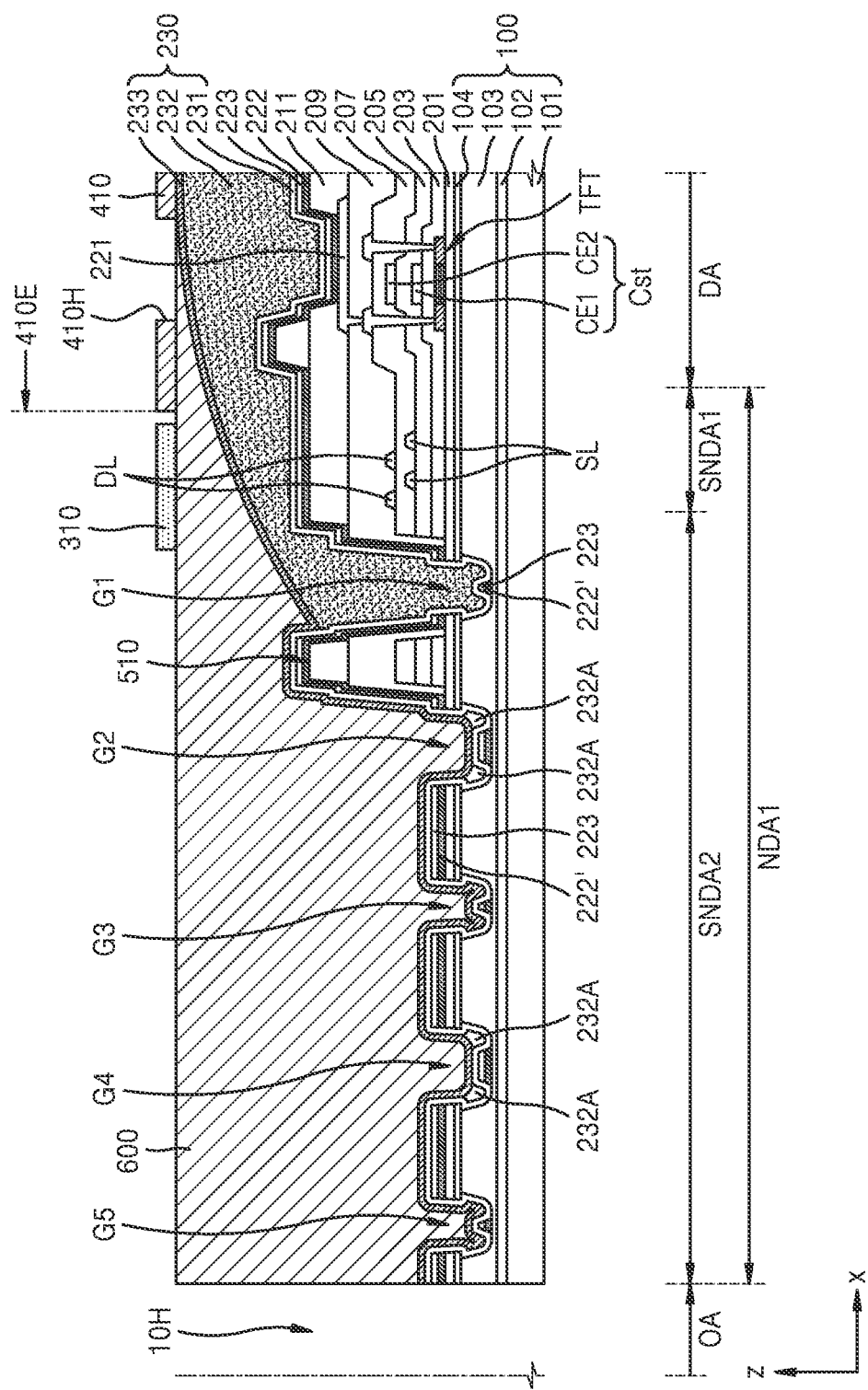
FIG. 28 is a cross-sectional view taken along the line III-III' of FIG. 10.

FIG. 28 may correspond to a cross-sectional view taken along the line III-III' of FIG. 10. However, FIG. 28 is equally applicable to a corresponding region of FIG. 16.

First, the display area DA of FIG. 28 is described.

The substrate 100 may include a polymer resin and include a plurality of layers. For example, the substrate 100 may include a base layer including a polymer resin and an inorganic layer. For example, the substrate 100 may include a first base layer 101, a first inorganic layer 102, a second base layer 103, and a second inorganic layer 104 that are sequentially stacked.

In an embodiment, each of the first and second base layers 101 and 103 may include a polymer resin. For example, each of the first and second base layers 101 and 103 may include a polymer resin, such as any of polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and cellulose acetate propionate (CAP). The polymer resin may be transparent.

Each of the first inorganic layer 102 and the second inorganic layer 104 may include a barrier layer configured to prevent or substantially prevent penetration of an external foreign substance and may include a single layer or a multi-layer including an inorganic material, such as silicon nitride (SiNx) and silicon oxide (SiOx).

A buffer layer 201 formed to prevent or substantially prevent impurities from penetrating into a semiconductor layer of a thin film transistor may be arranged on the substrate 100. The buffer layer 201 may include an inorganic material, such as silicon nitride or silicon oxide, and may include a single layer or a multi-layer. In an embodiment, the second inorganic layer 104 of the substrate 100 may be understood as a portion of the buffer layer 201, which is a multi-layer.

A pixel circuit including a thin film transistor TFT and a capacitor Cst may be arranged on the buffer layer 201.

The thin film transistor TFT may include a semiconductor layer on a buffer layer 201, a gate electrode on an insulating layer 203, and a source electrode and a drain electrode on an insulating layer 207.

The capacitor Cst includes a lower electrode CE1 and an upper electrode CE2 overlapping each other with an insulating layer 205 therebetween. The capacitor Cst may overlap the thin film transistor TFT. With regard to this, it is shown in FIG. 28 that the gate electrode of the thin film transistor TFT also serves as the lower electrode CE1 of the capacitor Cst. In another embodiment, the capacitor Cst may not overlap the thin film transistor TFT. The capacitor Cst may be covered by the insulating layer 207.

In an embodiment, the insulating layers 205 and 207 may include an inorganic insulating material such as silicon oxide, silicon nitride, silicon oxynitride, aluminum oxide, titanium oxide, tantalum oxide, and hafnium oxide. The insulating layers 205 and 207 may include a single layer or a multi-layer including the above materials.

The pixel circuit including the thin film transistor TFT and the capacitor Cst is covered by an insulating layer 209. The insulating layer 209 is a planarization insulating layer and may include an organic insulating layer. The insulating layer 209 may include a general-purpose polymer, such as any of polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the insulating layer 209 may include polyimide.

A display element, for example, an organic light-emitting diode is arranged on the insulating layer 209. A pixel electrode 221 of the organic light-emitting diode is arranged on the insulating layer 209 and may be connected to the pixel circuit through a contact hole of the insulating layer 209.

The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including Ag, Mg, Al, Pt, Pd, Au, Ni, Nd, Ir, Cr, or a compound thereof. In another embodiment, the pixel electrode 221 may further include a layer including ITO, IZO, ZnO, or $In_2O_3$ on and/or under the above reflective layer.

A pixel-defining layer 211 includes an opening exposing a top surface of the pixel electrode 221 and covers edges of the pixel electrodes 221. The pixel-defining layer 211 may include an organic insulating material. Alternatively, the pixel-defining layer 211 may include an inorganic insulating material or organic and inorganic insulating materials.

An intermediate layer 222 includes an emission layer. The emission layer may include a polymer or low molecular weight organic material that emits light of a predetermined color. In an embodiment, the intermediate layer 222 may include a first functional layer arranged under the emission layer and/or a second functional layer arranged on the emission layer.

The first functional layer may include a single layer or a multi-layer. For example, in a case in which the first functional layer includes a polymer material, the first functional layer may include a hole transport layer (HTL), which has a single-layered structure, and may include poly-(3,4)-ethylene-dihydroxy thiophene (PEDOT) or polyaniline (PANI). In a case in which the first functional layer includes a low molecular weight material, the first functional layer may include any of a hole injection layer (HIL) and an HTL.

In an embodiment, the second functional layer may be omitted. For example, in a case in which the first functional layer and the emission layer include a polymer material, the second functional layer may be provided to make a characteristic of the organic light-emitting diode excellent. The second functional layer may be a single layer or a multi-layer. In an embodiment, the second functional layer may include an electron transport layer (ETL) and/or an electron injection layer (EIL).

Some of the plurality of layers constituting the intermediate layer 222, for example, the functional layer(s), may be arranged in not only the display area DA but also in the first non-display area NDA1, and are disconnected by first to fifth grooves G1, G2, G3, G4, and G5, which will be described below, in the first non-display area NDA1.

An opposite electrode 223 faces the pixel electrode 221 with the intermediate layer 222 therebetween. The opposite electrode 223 may include a conductive material having a small work function. For example, the opposite electrode 223 may include a (semi)transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the above-mentioned material.

The display element may be covered by a thin-film encapsulation layer 230 to be protected by external foreign substances, moisture, etc. The thin-film encapsulation layer 230 is arranged on the opposite electrode 223. The thin-film encapsulation layer 230 may include at least one organic encapsulation layer and at least one inorganic encapsulation layer. It is shown in FIG. 28 that the thin-film encapsulation layer 230 includes first and second inorganic encapsulation layers 231 and 233 and an organic encapsulation layer 232 therebetween. In another embodiment, the number of organic encapsulation layers, the number of inorganic encapsulation layers, and a stacking sequence may be varied.

In an embodiment, the first and second inorganic encapsulation layers 231 and 233 may include one or more inorganic insulating materials, such as any of aluminum oxide, titanium oxide, tantalum oxide, hafnium oxide, zinc oxide, silicon oxide, silicon nitride, and silicon oxynitride, and may be formed by chemical vapor deposition (CVD). The organic encapsulation layer 232 may include a polymer-based material. In an embodiment, the polymer-based material may include any of an acrylic-based resin (e.g. polymethylmethacrylate (PMMA), polyacrylic acid), an epoxy-based resin, polyimide, and polyethylene.

In an embodiment, an input sensing layer is arranged on the thin-film encapsulation layer 230. With regard to this, FIG. 22 shows the first sensing electrode 410 arranged on the thin-film encapsulation layer 230. The first sensing electrode 410 includes a hole 410H corresponding to an emission area of the organic light-emitting diode as described above with reference to FIG. 9B. An end 410E of the first sensing electrode 410 on the organic light-emitting diode that is adjacent to the opening area OA may extend to the first non-display area NDA1 as described above with reference to FIG. 11.

The first non-display area NDA1 of FIG. 28 is described.

Referring to the first non-display area NDA1 of FIG. 28, the first non-display area NDA1 may include a first sub-non-display area SNDA1 that is relatively away from the opening area OA, and a second sub-non-display area SNDA2 that is relatively close to the opening area OA.

The first sub-non-display area SNDA1 is an area across which signal lines pass. The data lines DL and the scan lines SL of the first sub-non-display area SNDA1 may correspond to data lines and scan lines detouring the opening area OA described with reference to FIG. 5. The first sub-non-display area SNDA1 may include a wiring area or a detouring area across which signal lines pass.

The second sub-non-display area SNDA2 is a kind of groove area in which grooves are arranged. FIG. 28 shows first to fifth grooves G1, G2, G3, G4, and G5 arranged in the second sub-non-display area SNDA2. In an embodiment, each of the first to fifth grooves G1, G2, G3, G4, and G5 may have an undercut structure. The first to fifth grooves G1, G2, G3, G4, and G5 may be formed in a multi-layer including an organic layer and an inorganic layer. For example, the first to fifth grooves G1, G2, G3, G4, and G5 may be formed by removing a portion of the substrate 100 including a plurality of layers.

In an embodiment, each of the first to fifth grooves G1, G2, G3, G4, and G5 may be formed by etching the second base layer 103 and the second inorganic layer 104 thereon of the substrate 100. It is shown in FIG. 28 that the first to fifth grooves G1, G2, G3, G4, and G5 are formed by removing a portion of the second base layer 103 and a portion of the second inorganic layer 104. It is shown in FIG. 28 that the buffer 201 on the second inorganic layer 104 is concurrently (e.g., simultaneously) removed with the second inorganic layer 104. Although the buffer layer 201 and the second inorganic layer 104 are respectively denoted by different reference numerals in FIG. 28, the buffer layer 201 may be understood as one of layers of the second inorganic layer 104, which is a multi-layer, or the second inorganic layer 104 may be understood as one of layers of the buffer layer 201, which is a multi-layer.

In an embodiment, each of the first to fifth grooves G1, G2, G3, G4, and G5 may have an undercut structure in which a width passing through the second base layer 103 is greater than a width passing through an inorganic insulating layer(s), for example, the second inorganic layer 104 and/or the buffer layer 201. Through the undercut structure of the first to fifth grooves G1, G2, G3, G4, and G5, a portion 222' (e.g. the first and second functional layers) of the intermediate layer 222 and the opposite electrode 223 may be disconnected. It is shown in FIG. 28 that the portion 222' of the intermediate layer 222 and the opposite electrode 223 is disconnected around the first to fifth grooves G1, G2, G3, G4, and G5.

In an embodiment, the first inorganic encapsulation layer 231 of the thin-film encapsulation layer 230 may cover an inner surface of the first to fifth grooves G1, G2, G3, G4, and G5. The organic encapsulation layer 232 may cover the first groove G1 and fill the first groove G1 on the first inorganic encapsulation layer 231. In an embodiment, the organic encapsulation layer 232 may be formed by coating a monomer over the substrate 100 and hardening the monomer. In an embodiment, a partition wall 510 may be provided between the first and second grooves G1 and G2 so as to control a flow of the monomer and secure a thickness of the monomer (or the organic encapsulation layer). The partition wall 510 may include an organic insulating material.

In an embodiment, during a process of forming the organic encapsulation layer 232, there may be a material of the organic encapsulation layer 232 in some of the grooves. It is shown in FIG. 28 that there is an organic material 232A in the second and fourth grooves G2 and G4.

The second inorganic encapsulation layer 233 is arranged on the organic encapsulation layer 232 and may directly contact the first inorganic encapsulation layer 231 on the second to fifth grooves G2, G3, G4, and G5.

A planarization layer 600 may be located in the second sub-non-display area SNDA2 to cover at least one groove. For example, the planarization layer 600 may cover the first to fifth grooves G1, G2, G3, G4, and G5. The planarization layer 600 may cover the second to fifth grooves G2, G3, G4, and G5 and fill at least one of the second to fifth grooves G2, G3, G4, and G5. As shown in FIG. 28, a space of the second to fifth grooves G2, G3, G4, and G5 over the second inorganic encapsulation layer 233 may be filled with the planarization layer 600.

The planarization layer 600 may increase flatness of the display panel 10 around the opening area OA by covering an area of the second sub-non-display area SNDA2 that is not covered by the organic encapsulation layer 232. The planarization layer 600 may include an organic insulating material. While elements such as an anti-reflection member or a window, etc. are arranged on the display panel 10, the planarization layer 600 may prevent or substantially prevent the elements from being separated, or floated from the display panel 10, or being improperly coupled on the display panel 10.

The planarization layer 600 may extend on the thin-film encapsulation layer 230 and may be spatially separated from the organic encapsulation layer 232 by the second inorganic encapsulation layer 233. For example, like the planarization layer 600 is arranged on the second inorganic encapsulation layer 233, and the organic encapsulation layer 232 is arranged under the second inorganic encapsulation layer 233, the organic encapsulation layer 232 and the planarization layer 600 may be spatially separated from each other. The organic encapsulation layer 232 and the planarization layer 600 may not directly contact each other. In an embodiment, the planarization layer 600 may have a thickness of 5 μm or more.

The metal layer 30 (see FIG. 10) may be arranged on the planarization layer 600. FIG. 28 shows the first region 310, which is a portion of the metal layer 30. The first region 310, that is, the metal layer 30 may cover signal lines (e.g. the data lines DL and the scan lines SL) arranged in the first non-display area NDA1.

A width of the metal layer 30, for example, the first region 310 may be less than a width of the first non-display area NDA1 as described above with reference to FIG. 6. It is shown in FIG. 28 that the metal layer 30, for example, the first region 310, does not overlap the first to fifth grooves G1, G2, G3, G4, and G5. In another embodiment, the metal layer 30, for example, the first region 310, may overlap and cover at least one of the first to fifth grooves G1, G2, G3, G4, and G5.

Although it is shown in FIG. 28 that the metal layer 30 and the input sensing layer 40 are directly arranged on the planarization layer 600, this is for convenience of description. As shown in FIG. 8, at least one insulating layer, for example, the first insulating layer 41 and the second insulating layer 43 may be further arranged between the planarization layer 600 and the metal layer 30 and between the planarization layer 600 and the input sensing layer 40.

Figure 29:
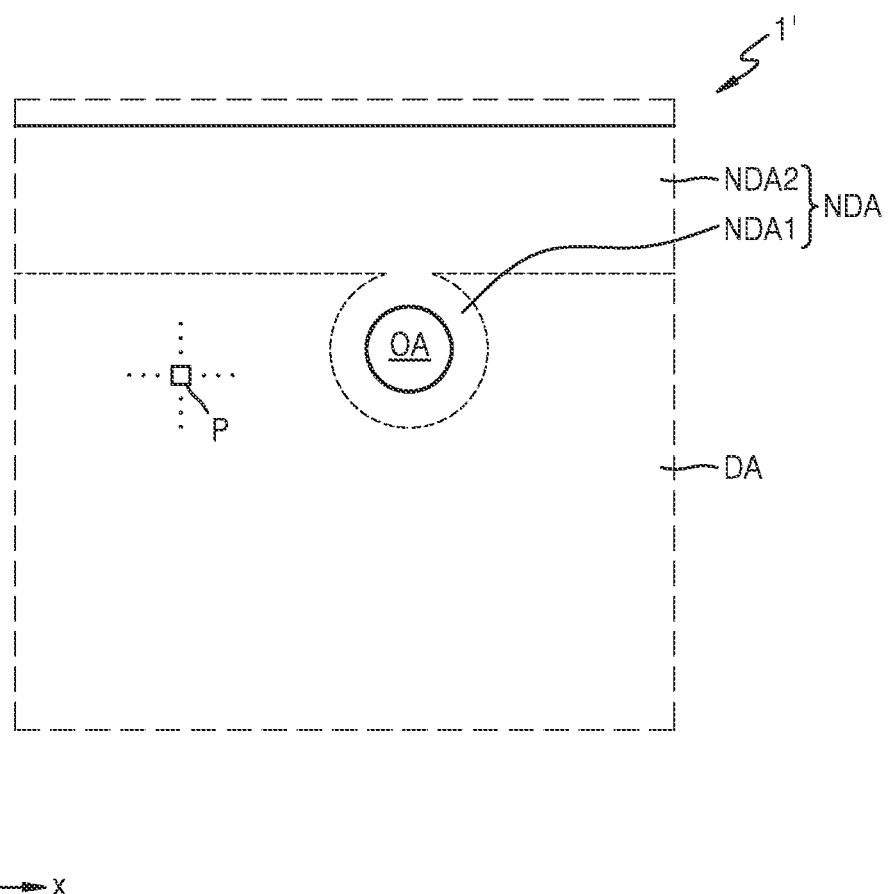
FIG. 29 is a plan view of a portion of a display device according to another embodiment.
Figure 30:
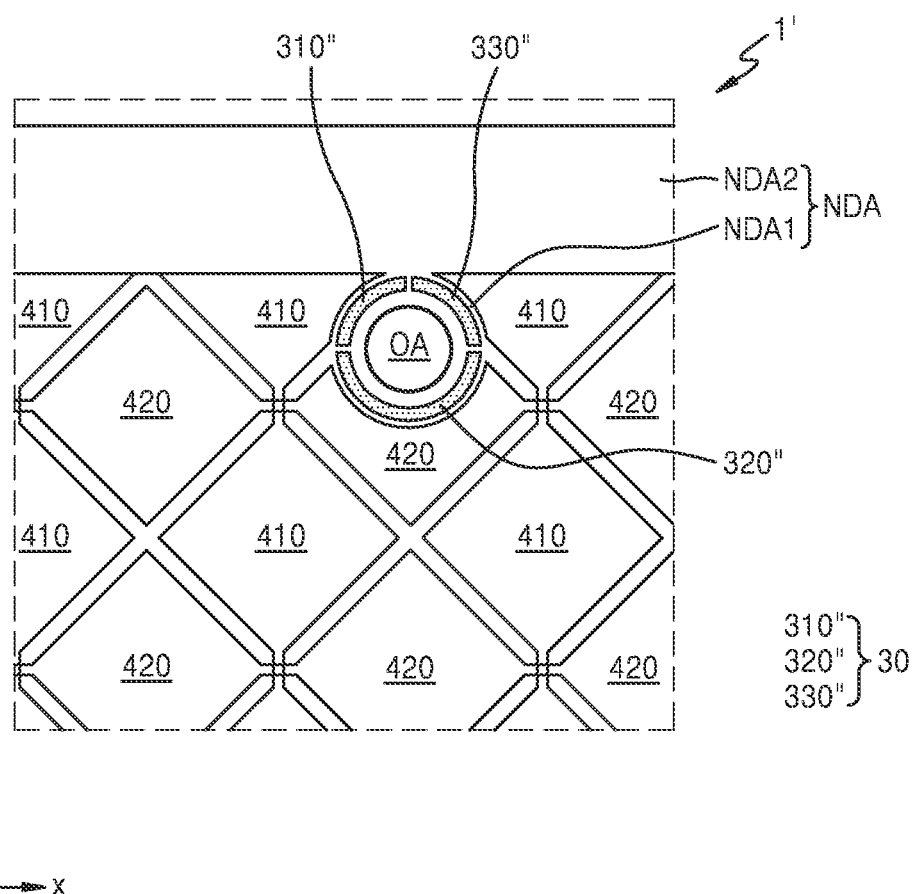
FIG. 30 is a plan view of a metal layer and an input sensing layer of the display device of FIG. 29.

FIG. 29 is a plan view of a portion of a display device 1' according to another embodiment; and FIG. 30 is a plan view of the metal layer 30 and the input sensing layer 40 of the display device 1' of FIG. 29.

Although it has been described that the opening area OA of the display device 1 is entirely surrounded by the display area DA, the present disclosure is not limited thereto. As shown in FIG. 29, in the display device 1', the opening area OA may be partially surrounded by the display area DA. In this case, the first non-display area NDA1 surrounding the opening area OA may be connected to the second non-display area NDA2 extending along an edge of the substrate 100.

Referring to FIG. 30, the metal layer 30 is arranged in the first non-display area NDA1 surrounding the opening area OA. The metal layer 30 may include a plurality of regions. For example, as shown in FIG. 30, the metal layer 30 may include first to third regions 310", 320", and 330". The metal layer 30 shown in FIG. 30 may have the same structure and/or characteristic as that of the embodiment described with reference to FIGS. 6 to 27 with only a difference in the number of regions.

Figure 31:
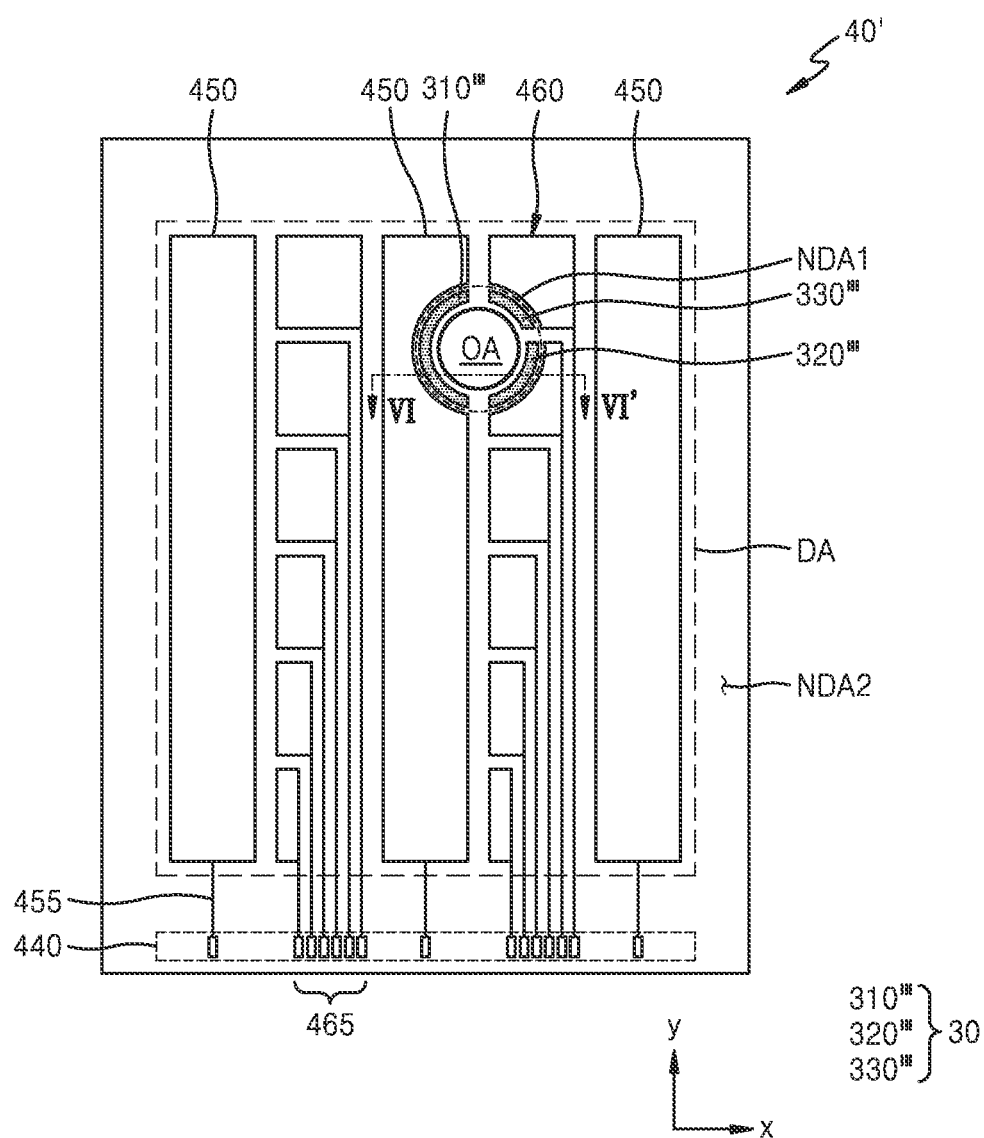
FIG. 31 is a plan view of an input sensing layer of a display panel according to another embodiment.
Figure 32:
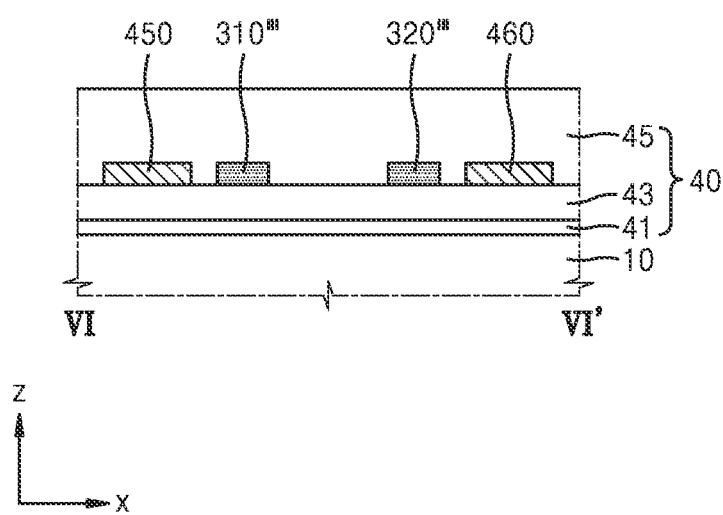
FIG. 32 is a cross-sectional view taken along the line VI-VI' of FIG. 31.

FIG. 31 is a plan view of an input sensing layer 40' of a display panel 10 according to another embodiment; and FIG. 32 is a cross-sectional view taken along the line VI-VI' of FIG. 31.

Referring to FIG. 31, the input sensing layer 40' may include first sensing electrodes 450, first trace lines 455 connected to the first sensing electrodes 450, second sensing electrodes 460, and second trace lines 465 connected to the second sensing electrodes 460. The first sensing electrodes 450 and the second sensing electrodes 460 may be arranged in the display area DA and connected to the sensing signal pad 440 through the first and second trace lines 455 and 465. A portion of the first and second trace lines 455 and 465 may be arranged in the display area DA.

The first sensing electrodes 450 and the second sensing electrodes 460 may be arranged along a y-direction, and the first sensing electrodes 450 and the second sensing electrodes 460 may be alternately arranged in an x-direction. The first sensing electrode 450 may extend along in the y-direction. The plurality of second sensing electrodes 460 may be arranged in the y-direction and arranged between the first sensing electrodes 450 arranged along the x-direction. The plurality of second sensing electrodes 460 may face one first sensing electrode 450. Although it is shown in FIG. 31 that six second sensing electrodes 460 correspond to one first sensing electrode 450, the number of first sensing electrodes 450 and the number of second sensing electrodes 460 may be varied depending on a touch resolution of the input sensing layer 40.

In an embodiment, the first sensing electrode 450 and the second sensing electrode 460 may have an approximately quadrangular shape. An area or a size of the plurality of second sensing electrodes 460 corresponding to one first sensing electrode 450 may be reduced toward the sensing signal pad 440.

At least one side of the first and second sensing electrodes 450 and 460 adjacent to the opening area OA may have a shape transformed along a circumference of the opening area OA. Accordingly, an area of the first and second sensing electrodes 450 and 460 adjacent to the opening area OA may be less than an area of the first and second sensing electrodes 450 and 460 in other areas. Areas or sizes of the first and second sensing electrodes 450 and 460 adjacent to the opening area OA may be different from each other. In an embodiment, the metal layer 30 may include a same material as that of one of the first and second sensing electrodes 450 and 460 and may be formed during a same process as a process of forming the first and second sensing electrodes 450 and 460.

The metal layer 30 is arranged in the first non-display area NDA1 surrounding the opening area OA. The metal layer 30 may include a plurality of regions. With regard to this, in an example of FIG. 31, the metal layer 30 includes first to third regions 310''', 320''', and 330'''. However, the metal layer 30 may include two or more regions, and the number of regions may be varied. The first to third regions 310''', 320''', and 330''' may be arranged in a circumferential direction surrounding an edge of the opening area OA. The first to third regions 310''', 320''', and 330''' may be spaced apart from each other.

Although not shown, at least one of the first to third regions 310''', 320''', and 330''' may be electrically connected to the first sensing electrode 450 or the second sensing electrode 460. Each of the first to third regions 310''', 320''', and 330''' may be electrically connected to a sensing electrode to which a voltage different from that of a sensing electrode adjacent thereto is applied. The first region 310''' adjacent to the first sensing electrode 450 may be electrically connected to the second sensing electrode 460 in the neighborhood. The second and third regions 320''' and 330''' adjacent to the second sensing electrode 460 may be electrically connected to the first sensing electrode 450 in the neighborhood.

As shown in FIG. 32, in an embodiment, the first sensing electrode 450, the second sensing electrode 460, and the metal layer 30 may be located on a same layer and may include a same material. The first sensing electrode 450, the second sensing electrode 460, and the metal layer 30 may be formed on the second insulating layer 43. The first sensing electrode 450 and the second sensing electrode 460 include metal. For example, the first sensing electrode 450 and the second sensing electrode 460 may include any of Mo, Al, Cu, and Ti and may include a single layer or a multi-layer including the above materials. In an embodiment, each of the first sensing electrode 450 and the second sensing electrode 460 may include a multi-layer including Ti/Al/Ti.

According to embodiments, a wiring of an opening area or around an opening may be prevented or substantially prevented from being viewed to the outside due to a metal layer arranged in the opening area or around the opening, and touch sensitivity of the opening area or around the opening may be prevented or substantially prevented from being reduced.

Although the disclosure has been described with reference to some embodiments illustrated in the drawings, this is merely provided as an example and it will be understood by those of ordinary skill in the art that various changes in form and details and equivalents thereof may be made therein without departing from the spirit and scope of the disclosure as set forth in the following claims.

What is claimed is:

1. A display apparatus comprising:
   a substrate comprising an opening area and a display area at least partially surrounding the opening area;
   a first sensing electrode in the display area adjacent to the opening area;
   a second sensing electrode in the display area adjacent to the opening area and facing the first sensing electrode in a first direction;
   a connection electrode in a non-display area between the opening area and the display area and electrically connected to the first sensing electrode and the second sensing electrode; and
   a metal layer in the non-display area and connected to the connection electrode.

2. The display apparatus of claim 1, further comprising a third sensing electrode in the display area adjacent to the opening area and adjacent to the first sensing electrode or the second sensing electrode.

3. The display apparatus of claim 2, wherein
   the metal layer in the non-display area comprises a first region and a second region spaced apart from each other.

4. The display apparatus of claim 3, wherein the first region is electrically connected to the first sensing electrode and the second sensing electrode, and the second region is electrically connected to the third sensing electrode.

5. The display apparatus of claim 2, further comprising a fourth sensing electrode in the display area adjacent to the opening area and facing the third sensing electrode in a second direction different from the first direction.

6. The display apparatus of claim 5, wherein the third sensing electrode and the fourth sensing electrode is one body.

7. The display apparatus of claim 5, wherein
   the metal layer in the non-display area comprises a first region and a second region spaced apart from each other.

8. The display apparatus of claim 7, further comprising a fifth sensing electrode in the display area adjacent to the opening area and facing the fourth sensing electrode in the first direction.

9. The display apparatus of claim 8, wherein the first region is electrically connected to the fourth sensing electrode, and the second region is electrically connected to the fifth sensing electrode, and
   wherein the fourth sensing electrode is electrically connected to the third sensing electrode.

10. The display apparatus of claim 1, wherein the connection electrode comprises:
    a first portion with a ring shape and disposed along an edge of the opening area; and
    a second portion protruded from the first portion and electrically connected to the first sensing electrode and the second sensing electrode, and
    wherein the first portion and the second portion is one body.

11. A display apparatus comprising:
    a substrate comprising an opening area and a display area at least partially surrounding the opening area;
    a first sensing electrode in the display area adjacent to the opening area;

a second sensing electrode in the display area adjacent to the opening area and facing the first sensing electrode in a first direction; and a metal layer in a non-display area between the opening area and the display area, wherein the metal layer comprises a first region and a second region spaced apart from each other in the first direction, each of the first region and the second region having an island shape in the non-display area, and wherein the first region is electrically connected to one of the first sensing electrode and the second sensing electrode, and the second region is electrically connected to another of the first sensing electrode and the second sensing electrode.

12. The display apparatus of claim 11, further comprising a third sensing electrode in the display area adjacent to the opening area and adjacent to the first sensing electrode or the second sensing electrode;

a fourth sensing electrode in the display area adjacent to the opening area and facing the third sensing electrode in the first direction; and a connection electrode in the non-display area and electrically connected to the third sensing electrode and the fourth sensing electrode.

13. The display apparatus of claim 12, wherein the metal layer further comprises a third region spaced apart from the first region and the second region, and wherein the third region is electrically connected to the connection electrode.

14. The display apparatus of claim 12, wherein the connection electrode comprises a first electrode with a ring shape and disposed along an edge of the opening area; and a second electrode protruded from the first electrode and connected to the third sensing electrode and the fourth sensing electrode.

15. The display apparatus of claim 11, wherein the metal layer comprises a metal having a light-blocking characteristic.

16. A display apparatus comprising:

a substrate comprising an opening area and a display area at least partially surrounding the opening area;

first sensing electrodes in the display area adjacent to the opening area and spaced apart from each other;

second sensing electrodes in the display area adjacent to the opening area and spaced apart from each other, each of the second sensing electrodes being between the first sensing electrodes; and a metal layer in a non-display area between the opening area and the display area, wherein the metal layer comprises a plurality of regions spaced apart from each other and from the first and second sensing electrodes in a plan view and arranged along an edge of the opening area, and wherein each of the plurality of regions is electrically connected to one of the first sensing electrodes and the second sensing electrodes.

17. The display apparatus of claim 16, further comprising a connection electrode in the non-display area and electrically connected to a pair of first sensing electrodes facing each other with the opening area therebetween.

18. The display apparatus of claim 17, wherein the connection electrode comprises a first electrode with a ring shape and disposed along an edge of the opening area; and a second electrode protruded from the first electrode and electrically connected to the pair of first sensing electrodes.

19. The display apparatus of claim 17, wherein one of the plurality of regions electrically connected to one of the first sensing electrodes is electrically connected to the connection electrode.

20. The display apparatus of claim 16, wherein sizes of the plurality of regions are different from each other.

21. The display apparatus of claim 16, wherein the metal layer comprises a metal having a light-blocking characteristic.

22. The display apparatus of claim 16, wherein the metal layer is located on a same layer as the first and second sensing electrodes.

* * * * *